(12) United States Patent
El-Khamy et al.

(10) Patent No.: US 9,504,042 B2
(45) Date of Patent: Nov. 22, 2016

(54) SYSTEM AND METHOD FOR ENCODING AND DECODING OF DATA WITH CHANNEL POLARIZATION MECHANISM

(71) Applicant: Samsung Electronics Co., Ltd., Suwon-si, Gyeonggi-Do (KR)

(72) Inventors: Mostafa El-Khamy, San Diego, CA (US); Hessam Mahdavifar, San Diego, CA (US); Gennady Feygin, San Diego, CA (US); Jungwon Lee, San Diego, CA (US); Inyup Kang, San Diego, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 90 days.

(21) Appl. No.: 14/522,924

(22) Filed: Oct. 24, 2014

(65) Prior Publication Data

US 2015/0349909 A1 Dec. 3, 2015

Related U.S. Application Data

(60) Provisional application No. 62/004,106, filed on May 28, 2014.

(51) Int. Cl.
| | |
|---|---|
| *H04B 7/216* | (2006.01) |
| *H04W 72/04* | (2009.01) |
| *H03M 13/13* | (2006.01) |
| *H04W 28/06* | (2009.01) |

(52) U.S. Cl.
CPC ......... *H04W 72/0466* (2013.01); *H03M 13/13* (2013.01); *H04W 28/06* (2013.01)

(58) Field of Classification Search
CPC ...................................................... H04M 1/00
See application file for complete search history.

(56) References Cited

U.S. PATENT DOCUMENTS

| | | |
|---|---|---|
| 8,347,186 B1 | 1/2013 | Arikan |
| 2013/0117344 A1 | 5/2013 | Gross et al. |
| 2013/0198583 A1* | 8/2013 | Shen ..................... H03M 13/15 714/756 |
| 2013/0283128 A1 | 10/2013 | Lee et al. |
| 2014/0019820 A1 | 1/2014 | Vardy et al. |
| 2014/0040214 A1 | 2/2014 | Ma |

OTHER PUBLICATIONS

IEEE, Apr. 10, 2013, How to construct polar codes, Ido Tal.*
E. Arikan "Channel polarization: A method for constructing capacity-achieving codes for symmetric binary-input memoryless channels." IEEE Transactions on Information Theory, 55.7 (2009): 3051-3073.
E. Arikan and I. E. Telatar. "On the rate of channel polarization" Information Theory, 2009. ISIT 2009. IEEE International Symposium on. IEEE, 2009.
I. Tal and A. Vardy "How to Construct Polar Codes." IEEE Transactions on Information Theory, 59.10 (2013): 6562-6582.

* cited by examiner

*Primary Examiner* — Maharishi Khirodhar
(74) *Attorney, Agent, or Firm* — IP Investment Law Group

(57) ABSTRACT

A computing system includes: a communication unit configured to: determine a relaxed coding profile including a polar-processing range for processing content data over a bit channel; process the content data based on a total polarization level being within the polar-processing range, the polar-processing range for controlling a polar processing mechanism or a portion therein corresponding to the bit channel for the content data; and an inter-device interface, coupled to the communication unit, configured to communicate the content data.

20 Claims, 5 Drawing Sheets

SYSTEM AND METHOD FOR ENCODING AND DECODING OF DATA WITH CHANNEL POLARIZATION MECHANISM

CROSS-REFERENCE TO RELATED APPLICATION(S)

This application claims the benefit of U.S. Provisional Patent Application Ser. No. 62/004,106 filed May 28, 2014, and the subject matter thereof is incorporated herein by reference thereto.

TECHNICAL FIELD

An embodiment of the present invention relates generally to a computing system, and more particularly to a system with coding based on channel polarization mechanism.

BACKGROUND

Modern consumer and industrial electronics, especially devices such as cellular phones, navigations systems, portable digital assistants, and combination devices, are providing increasing levels of functionality to support modern life including mobile communication. Research and development in the existing technologies can take a myriad of different directions.

The increasing demand for information in modern life requires users to access information at any time, at increasing data rates. However, telecommunication signals used in mobile communication effectively experience various types of interferences from numerous sources, as well as computational complexities rising from numerous possible formats for communicated information, which affect the quality and speed of the accessible data.

Thus, a need still remains for a system with capacity-achieving source and channel coding mechanisms. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a computing system, including: a communication unit configured to: determine a relaxed coding profile including a polar-processing range for processing content data over a bit channel; process the content data based on a total polarization level being within the polar-processing range, the polar-processing range for controlling a polar processing mechanism or a portion therein corresponding to the bit channel for the content data; and an inter-device interface, coupled to the communication unit, configured to communicate the content data.

An embodiment of the present invention provides a method of operation of a computing system including: determining a relaxed coding profile including a polar-processing range for processing content data over a bit channel; processing the content data with a communication unit based on a total polarization level being within the polar-processing range, the polar-processing range for controlling a polar processing mechanism or a portion therein corresponding to the bit channel for the content data; and communicating the content data.

An embodiment of the present invention provides a method of operation of a computing system including: determining an error measure for representing a bit channel associated with communicating content data; calculating a relaxation range based on a target error, a communication rate, a polar code length, or a combination thereof for communicating the content data; and generating a relaxed coding profile with a communication unit based on the relaxation range for a relaxed communication mechanism for controlling a polar processing mechanism processing for the content data corresponding to the bit channel based on the relaxation range.

An embodiment of the present invention provides a non-transitory computer readable medium including instructions for operating a computing system including: determining an error measure for representing a bit channel associated with communicating content data; calculating a relaxation range based on a target error, a communication rate, a polar code length, or a combination thereof for communicating the content data; and generating a relaxed coding profile based on the relaxation range for a relaxed communication mechanism for controlling a polar processing mechanism processing for the content data corresponding to the bit channel based on the relaxation range.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
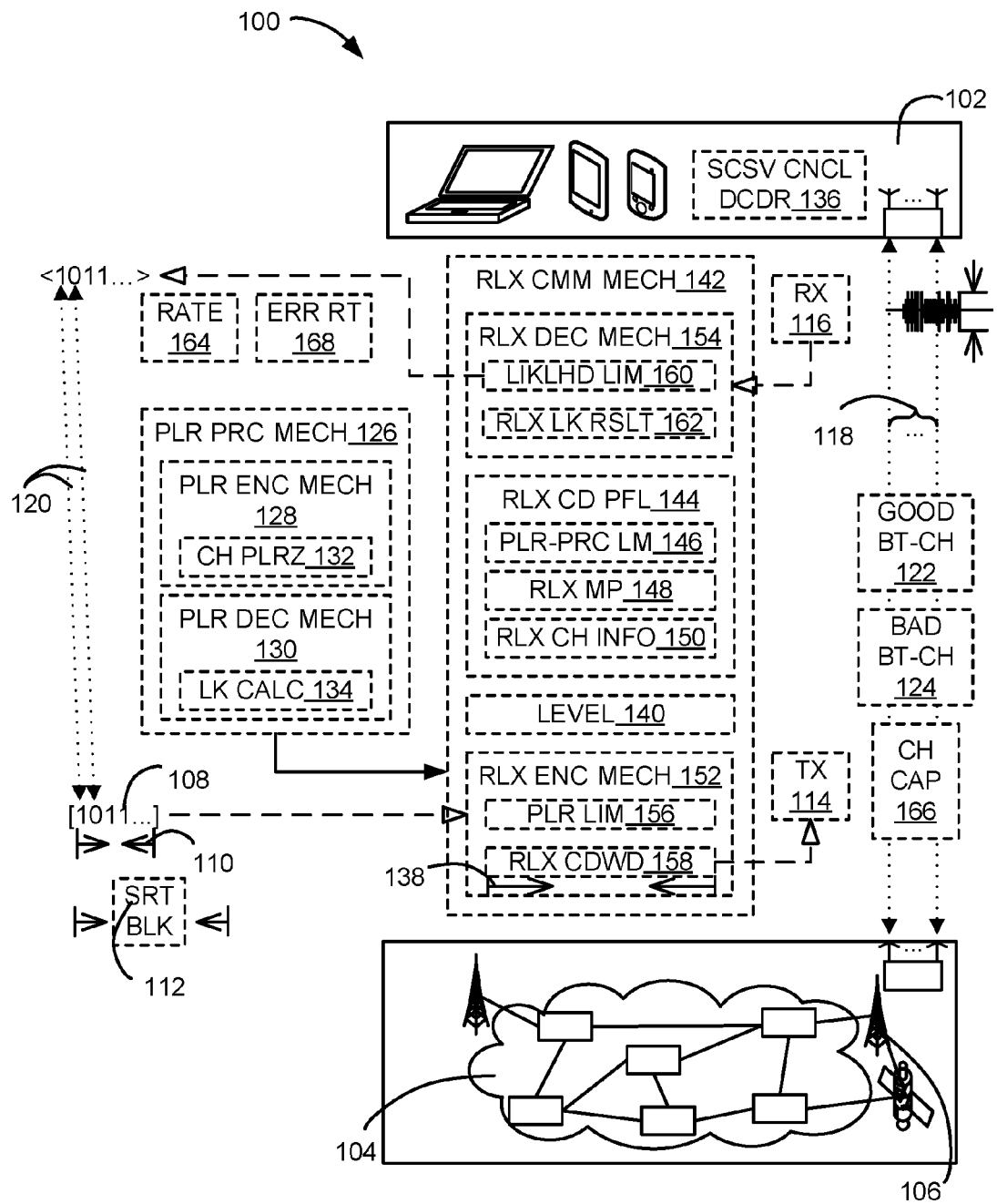
FIG. 1 is a computing system with polar coding mechanism in an embodiment of the present invention.

The following embodiments of the present invention can be used to implement relaxed communication mechanism. A relaxed coding profile can be used to limit channel polarization or likelihood calculation for processing content data for communication between devices. The relaxed coding profile based on relaxation range for evaluating bit channel can be used to limit the processing up to a level less than total polarization level.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include or be implemented as software, hardware, or a combination thereof in the present invention in accordance with the context in which the term is used. For example, the software can be machine code, firmware, embedded code, and application software. The software can also include a function, a call to a function, a code block, or a combination thereof. Also for example, the hardware can be gates, circuitry, processor, computer, integrated circuit, integrated circuit cores, a microelectromechanical system (MEMS), physical non-transitory memory medium having instructions for performing the software function, a portion therein, or a combination thereof.

The term "processing" as used herein includes manipulating signal and corresponding data, such as filtering, detecting, decoding, assembling data structures, transferring data structures, manipulating data structures, and reading and writing data structures. Data structures are defined to be information arranged as symbols, packets, blocks, files, input data, system generated data, such as calculated or generated data, and program data.

Referring now to FIG. 1, therein is shown a computing system 100 with polar coding mechanism in an embodiment of the present invention. The computing system 100 can include, but not limited to a communication system, a data storage system, data compression system, or data sensing system.

The computing system 100 includes a first device 102, such as a mobile device including a cellular phone or a notebook computer, connected to a network 104. The first device 102 can further include a wired device, such as a modem or a router. The first device 102 can further include a circuit or a device within a comprehensive device, such as a portion or circuit specializing in processing information within a storage device or system.

The first device 102 can include a user equipment (UE). The first device 102 can also be part of a data storage system such as hard disk drive or flash memory. The first device 102 can also be part of a data reconstruction system, voice decompression, video decompression, or data sensing system.

The network 104 is a system of wired or wireless communication devices or means that are connected to each other for enabling communication between devices. For example, the network 104 can include a combination of wires, transmitters, receivers, antennas, towers, stations, repeaters, telephone network, servers, or client devices for a wireless cellular network. The network 104 can also include a combination of routers, cables, computers, servers, and client devices for various sized area networks. Also for example, the network 104 can include a communication bus, a wire, a cable, a wireless connection, or a combination thereof between units within a device.

The computing system 100 can include a second device 106 for directly or indirectly linking and communicating with the first device 102. The network 104 can include or couple to the second device 106. The second device 106 can receive wireless signals from the first device 102, transmit signals to the first device 102, process signals, or a combination thereof. The second device 106 can also relay signals between other base stations, components within the network 104, or a combination thereof. The second device 106 can also be part of a data storage system such as hard disk drive or flash memory. The second device 106 can also be part of a data compression system, voice compression, video compression, or data sensing system.

The first device 102 can be connected to the network 104 through the second device 106. For example, the second device 106 can be a coordinating device or a controlling device for communication in the computing system 100, a base station, an evolved node B (eNodeB), a server, a router, a modem, or a combination thereof. As a more specific example, the second device 106 can include the coordinating device or the controlling device controlling, managing, or scheduling functions, actions, tasks, or a combination thereof for various devices within the computing system 100.

Also for example, the second device 106 can be a communication device or a processing component included or with a cell tower, a wireless router, an antenna, or a combination thereof being used to communicate with, such as by sending signals to or receiving signals from, the first device 102 including a mobile computing device. Also for example, the second device 106 can include a portion or circuit specializing in storing information within the storage device or system.

The first device 102 can connect to and communicate with other devices, such as other mobile devices, servers, computers, telephones, or a combination thereof. For example, the first device 102 can communicate with other devices by transmitting signals, receiving signals, processing signals, or a combination thereof and displaying content of the signals, audibly recreating sounds according to the content of the signals, processing according to the content, such as storing an application or updating an operating system, or a combination thereof.

The second device 106 can be used to wirelessly exchange signals for communication, including voice signals of a telephone call or data representing a webpage and interactions therewith. The second device 106 can also transmit reference signals, training signals, error detection signals, error correction signals, header information, transmission format, protocol information, or a combination thereof.

Based on the communication method, such as code division multiple access (CDMA), orthogonal frequency-division multiple access (OFDMA), Third Generation Partnership Project (3GPP), Long Term Evolution (LTE), or fourth generation (4G) standards, the communication signals can include a reference portion, a header portion, a format portion, an error correction or detection portion, or a combination thereof imbedded in the communicated information. The reference portion, header portion, format portion, error correction or detection portion, or a combination thereof can include a predetermined bit, pulse, wave, symbol, or a combination thereof. The various portions can be embedded within the communicated signals at regular time intervals, frequency, code, or a combination thereof.

For illustrative purposes, the computing system 100 will be described as a communication system with the first device 102 as a user equipment, such as a mobile device, and the second device 106 as a base station or the coordinating device. However, it is understood that the computing system 100 can be different, such as a memory system with the first device 102 as a processing portion in a disc drive or a device focusing on processing in a memory system, and the second device 106 as a storage portion in the disc drive or a device focusing on storing in the memory system.

The computing system 100 can communicate or exchange content data 108 between devices, such as between the first device 102 and the second device 106. The content data 108 can include information intended for communication to a receiving device from a transmitting device, such as for reproduction or execution at the receiving device as intended by the transmitting device.

The content data 108 can include a block length 110. The block length 110 can represent a quantity, a magnitude, a size, an amount, or a combination thereof describing the content data 108. The block length 110 can represent the content data 108 formatted or grouped for a specific instance or segment of transmission, such as for a packet or a transmission block.

The content data 108 can include a short block 112. The short block 112 can include the content data 108 with the block length 110 less than a threshold predetermined by the computing system 100, a communication threshold, or a combination thereof.

The computing system 100 can transmit a transmitter signal 114 for sending the content data 108. The transmitter signal 114 can include information signal that is actually transmitted from a device. The transmitter signal 114 can be based on the content data 108, such as following an encoding process, formatting process, modulation process, or a combination thereof for the content data 108. The transmitter signal 114 can be generated by the transmitting device, such as the second device 106.

The computing system 100 can further receive a receiver signal 116 for receiving the content data 108. The receiver signal 116 can include information signal that is actually detected by a different device. The receiver signal 116 can correspond to the transmitter signal 114. The receiver signal 116 can include the content data 108. The receiver signal 116 can be received by the receiving device, such as the first device 102. The first device 102 can process the receiver signal 116 to recover or estimate the content data 108.

The transmitter signal 114 can traverse a communication channel 118 and be received as the receiver signal 116. The communication channel 118 can include a direct link between corresponding devices, such as between the first device 102 and the second device 106. The communication channel 118 can also include repeaters, amplifiers, or a combination thereof there-between for an indirect link.

The communication channel 118 can include or correspond to a specific instance or value of communication detail, such as frequency, time slot, packet designation, transmission rate, channel code, or a combination thereof used for transmitting signals between intended devices. The communication channel 118 can further include physical characteristics unique to geographic locations associated with the intended devices. The communication channel 118 can include structures or influences, such as fading characteristics of signals or causes for unique delay or reflection of signals, affecting the transmission of wireless signals.

The communication channel 118 can distort or alter the signals traversing therein. For example, the receiver signal 116 can include the transmitter signal 114 altered or changed based on traversing the communication channel 118. The receiver signal 116 can further include noise from the communication channel 118, the computing system 100, such as the first device 102 or the second device 106, or a combination thereof.

The communication channel 118 can include one or multiple instances of a bit channel 120. The bit channel 120 is a representation of influences and the processes between a bit in the content data 108 associated with a transmitting device and a corresponding value in a processing result representing an estimation or recovery of the content data 108 with a receiving device. The bit channel 120 can include effects or influences from the communication channel 118, from processes at the transmitting device or the receiving device, or a combination thereof.

The computing system 100 can utilize one or multiple instances of a good bit-channel 122, one or multiple instances of a bad bit-channel 124, or a combination thereof for communicating the content data 108 using a polar processing mechanism 126. The good bit-channel 122 is an instance of the bit channel 120 including a characteristic or a trait for communicating information. The bad bit-channel 124 is an instance of the bit channel 120 lacking the characteristic or the trait for communicating information.

For example, the good bit-channel 122 and the bad bit-channel 124 can be based on a communication speed, an error rate or probability, noise level, interference level, efficiency rating, load, capacity, or a combination thereof for the bit channel 120. The computing system 100 can determine or classify the bit channel 120 as the good bit-channel 122 or the bad bit-channel 124 based on a method, a process, a threshold, or a combination thereof predetermined by the computing system 100, the communication standard, the polar processing mechanism 126, or a combination thereof.

The polar processing mechanism 126 is a method, a process, or a combination thereof for providing linear block error correcting code based on transforming bit channels. The polar processing mechanism 126 can be based on applying transformation operations to convert one or more instances of the bit channel 120. The transformation operations can be based on or include channel polarization 132. The polar processing mechanism 126 can normally be for fully polarizing instances of the bit channel 120 without a limiting condition for the polarization process. The polar processing mechanism 126 can include a polar encoding mechanism 128 corresponding to encoding and transmitting the content data 108.

The polar encoding mechanism 128 is a method, a process, or a combination thereof for encoding information for the linear block error correcting code based on transforming bit channels. The polar encoding mechanism 128 can be based on or include channel polarization 132. The channel polarization 132 is a method, a process, or a combination thereof for applying transformation operations to the bit channel 120. The channel polarization 132 can include converting an ensemble of mediocre bit channels into disjoint subsets. The channel polarization 132 can utilize a polarization element, such as a factor or a matrix.

The channel polarization 132 can determine or generate from the transformation one or more instances of the good bit-channel 122 with improved or satisfactory levels of reliability, or reduced noise or interference therefrom. The channel polarization 132 can determine or generate from the transformation one or more instances of the bad bit-channel 124 with worsened or unsatisfactory levels of reliability, or increased noise or interference therefrom.

For example, the channel polarization 132 can transform the bit channel 120 or copies thereof into a noise-free channel or the good bit-channel 122, a very-noise channel or the bad bit-channel 124, or a combination thereof. The channel polarization 132 can include the polarization element of any dimension greater than 1. As a more specific example, the channel polarization 132 can include the polarization element of dimension 2 represented as $$`G = \begin{bmatrix} 1 & 0 \\ 1 & 1 \end{bmatrix}`.$$

Continuing with the specific example, two instances or copies of the bit channel 120 can be transformed into the good bit-channel 122 and the bad bit-channel 124, one instance each, represented as '(W,W)→(W$^-$, W$^+$)'. The two instances or copies of the bit channel 120 can be represented as 'W'. The good bit-channel 122 can include an upgraded channel represented as 'W$^+$'. The bad bit-channel 124 can include a degraded channel represented as 'W$^-$'.

The computing system 100 can utilize the polar encoding mechanism 128 and the channel polarization 132 to carry the information bits, such as the content data 108, on one or more instances of the good bit-channel 122 or the upgraded channels. The computing system 100 can freeze one or more instances of the bad bit-channel 124 or the degraded channels to a predetermined value, such as zero. The computing system 100 can transmit the transmitter signal 114 including the information bits or the content data 108 transmitted over the good bit-channel 122 and the predetermined value transmitted over the bad bit-channel 124.

Continuing with the specific example above, the computing system 100 can generate a polar code with a polar code length 138 utilizing the polar encoding mechanism 128. The polar code can be a processing result of the encoding process corresponding to the content data 108. The polar code can be transmitted as the transmitter signal 114. The polar code length 138 can represent a quantity, a magnitude, a size, an amount, or a combination thereof describing the polar code. The polar code length 138 can be represented as '1'.

Continuing with the specific example, the channel polarization 132 can be based on '1×1' channel transformation utilizing n-fold Kronecker power of 'G'. The term 'n' can represent a total polarization level 140. The total polarization level 140 can represent a number or a magnitude of the channel polarization 132 applied for the polar code. The total polarization level 140 can be further represented as 'n=log 1'. The basis for the logarithm can be based on the channel polarization 132, the dimension of the polarization element 'G', or a combination thereof. For the specific example above, the basis of the logarithm can be 2. The 'n'th Kronecker power can be represented in terms of the 'n-1'th Kronecker power as $$`G = G^{\otimes n} = \begin{bmatrix} G^{\otimes(n-1)} & 0 \\ G^{\otimes(n-1)} & G^{\otimes(n-1)} \end{bmatrix}`,$$

for the specific example.

For example, the total polarization level 140 can describe highest or greatest amount or number of iterations or processing levels for the polar processing mechanism 126 or a portion therein amongst processing levels or iterations, instances of the bit channel 120, or a combination thereof. Also for example, the total polarization level 140 can describe highest instances of nodes or greatest amount of dependency levels for processing associated with any one instance of the bit channel 120 available for communication between the first device 102 and the second device 106. Also for example, the total polarization level 140 can describe total or overall amount or number of iterations or processing for the polar processing mechanism 126 or a portion therein.

The content data 108 can be represented as '$u_1^l = \{u_1, u_2, \ldots, u_l\}$' corresponding to a vector of 'l' independent and uniform binary random variables. Some indices of $u_1^l$ can correspond to the content data and the other indices of $i_1^l$ can correspond to the frozen bits. The encoding of the content data 108 can be done with the channel polarization transformation 132, such as the polar code word resulting from the polar encoding mechanism 128, can be given by '$x_1^l = u_1^l G_l$'. The corresponding instance of the transmitter signal 114 can transmit '$x_1^l$' through 'l' independent copies of the bit channel 120 corresponding to a discrete memoryless channel 'W'.

The polar processing mechanism 126 can further include a polar decoding mechanism 130 corresponding to decoding and recovering the content data 108. The polar decoding mechanism 130 is a method, a process, or a combination thereof for decoding information for the linear block error correcting code based on transformed bit channels. The polar decoding mechanism 130 can be based on error-correcting, formatting, or processing information complementary to the polar encoding mechanism 128.

The polar decoding mechanism 130 can include likelihood calculation 134. The likelihood calculation 134 is a method, a process, or a combination thereof for determining a possibility or a chance that received information was originally transmitted or intended to be a specific value.

The likelihood calculation 134 can generate a value representing the possibility or the chance, a ratio including a likelihood ratio, a logarithmic value, or a combination thereof as a calculation result. For example, the likelihood calculation 134 can generate a likelihood ratio (LR) or a log-likelihood ratio (LLR) for a portion or a segment in the receiver signal 116 corresponding to various possible values of a bit, a symbol, or a combination thereof.

The polar decoding mechanism 130 can be based on utilizing a successive cancellation decoder 136. The successive cancellation decoder 136 can include a decoder having a specific method, process, circuit, or a combination thereof for iteratively processing, identifying, removing, or a combination of processes thereof for unwanted or undesirable portions of the received signal in decoding for the content data 108. The first device 102, the second device 106, or a combination thereof can include the successive cancellation decoder 136.

For example, channel output alphabet, such as the receiver signal 116 or a portion therein can be represented as 'Y'. The channel transformations can be represented as 'W: $\{0,1\} \to Y$', 'W$^-$: $\{0,1\} \to Y^2$', 'W$^+$: $\{0,1\} \to \{0,1\} \times Y^2$', or a combination thereof. For the 'i'th bit-channel, the successive cancellation decoder 136 can decode or have decoded all the preceding 'i−1' bits and are available at channel output, together with all 'l' channel observations for a code of length 'l', when decoding the 'i'th bit.

As a more specific example, channel transition probability or a set thereof for the polarized channels can be represented as:

$$W^-(y_1,y_2|x_1) = \tfrac{1}{2} \sum_{x_2 \in \{0,1\}} W(y_1 \oplus x_2) W(y_2|x_2),$$

$$W^+(y_1,y_2,x_1|x_2) = \tfrac{1}{2} W(y_1 x_1 \oplus x_2) W(y_2|x_2). \quad \text{Equation(1).}$$

The successive cancellation decoder 136 can decode '$x_1$' with the knowledge of channel observations or the receiver signal 116 represented as '$\{y_1, y_2\}$'. The successive cancellation decoder 136 can then decode '$x_2$' with the knowledge of the channel observations as well as the decoded instance of '$x_1$'.

The computing system 100 can further utilize a relaxed communication mechanism 142 to communicate the content data 108. The relaxed communication mechanism 142 is a method, a process, or a combination thereof for providing linear block error correcting code based on transforming bit channels and based on utilizing limits on processes. The relaxed communication mechanism 142 can be similar to or utilize portions of the polar processing mechanism 126 but limits executions or iterations of the channel polarization, the likelihood calculation 134, or a combination thereof.

The relaxed communication mechanism 142 can include a relaxed coding profile 144. The relaxed coding profile 144 is a representation of control information for the relaxed communication mechanism 142. The relaxed communication mechanism 142 can include the relaxed coding profile 144 associated with the encoding process, the decoding process, or a combination thereof.

The relaxed coding profile 144 can include thresholds, processing limitations or limiting conditions, polar processing range, descriptions or instructions for various total polarization levels or iterations, associated channel information, or a combination thereof. The computing system 100 can use the relaxed coding profile 144 to limit processes for implementing the relaxed communication mechanism 142.

For example, the relaxed coding profile 144 can include a polar-processing range 146, a relaxed map 148, a relaxed channel information 150, or a combination thereof. The polar-processing range 146 constitutes control parameters for controlling or limiting execution the polar processing mechanism 126 or a portion therein for the relaxed communication mechanism 142, or a modification in implementation of the polar processing mechanism 126 or a portion therein for the relaxed communication mechanism 142.

As a more specific example, the polar-processing range 146 can include a description of a channel condition, a polarization result, such as from the channel polarization 132 or the likelihood calculation 134, or a combination thereof for limiting the execution or modifying the implementation of the polar processing mechanism 126 or the portion therein. Also as a more specific example, the polar-processing range 146 can include an iteration limit, a status or authorization for implementing or performing a process, a condition for switching to a different channel polarization processes or a different channel polarization element including $$G = \begin{bmatrix} 1 & 0 \\ 0 & 1 \end{bmatrix},$$

or a combination thereof.

The relaxed map 148 is control information for implementing the relaxed communication mechanism 142 for each processing level or iteration, for each instance of the bit channel 120, or a combination thereof. The relaxed map 148 can be used to limit a process associated with the polar processing mechanism 126 to be less than the total polarization level 140 for one or more specific instances of the bit channel 120.

For example, the relaxed map 148 can include a command, an authorization, a Boolean value, or a combination thereof for implementing the channel polarization 132, the likelihood calculation 134, or a combination thereof for each processing level or iteration, for each instance of the bit channel 120, or a combination thereof. Also for example, the relaxed map 148 can include a condition for switching to another instance of the channel polarization 132 with a different channel polarization element such as $$`G = \begin{bmatrix} 1 & 0 \\ 0 & 1 \end{bmatrix},$$

the likelihood calculation 134, or a combination thereof for each processing level or iteration, for each instance of the bit channel 120, or a combination thereof. Also for example, the relaxed map 148 can include descriptions or instructions specific for implementing the relaxed communication mechanism 142 for each processing level or iteration, for each instance of the bit channel 120, or a combination thereof.

The relaxed channel information 150 is a description for transformation of the bit channel 120 for communicating the content data 108. The relaxed channel information 150 can include descriptions for instances of the bit channel 120 applicable for communicating the content data 108 between the first device 102 and the second device 106.

For example, the relaxed channel information 150 can include identification of one or more instances of the good bit-channel 122, one or more instances of the bad bit-channel 124, or a combination thereof for the grouping of the bit channel 120. Also for example, the relaxed channel information 150 can include quality, characteristic, aspect, relative comparison or ranking thereof, or a combination thereof for the grouping of the bit channel 120, the set of good bit-channel 122 therein, the bad bit-channel 124 therein, or a combination thereof.

The relaxed communication mechanism 142 can further include a relaxed encoding mechanism 152, a relaxed decoding mechanism 154, or a combination thereof. The relaxed encoding mechanism 152 is a method, a process, or a combination thereof for encoding information for the linear block error correcting code based on a channel polarization transformation of the bit channels based on utilizing limits on processes or switching between different channel polarization processes.

The relaxed encoding mechanism 152 can be similar to the polar encoding mechanism 128. The relaxed encoding mechanism 152 can utilize the polar encoding mechanism 128 utilizing the relaxed coding profile 144 to limit the polar encoding mechanism 128 to process the content data 108.

For example, the relaxed encoding mechanism 152 can utilize a polarization limit 156. The polarization limit 156 is the polar-processing range 146 specific for utilizing the polar encoding mechanism 128 for the relaxed encoding mechanism 152. The polarization limit 156 can limit the channel polarization 132 for the relaxed encoding mechanism 152, or switch to a different channel polarization 132 with another channel polarization element.

The relaxed encoding mechanism 152 can generate a relaxed code word 158. The relaxed code word 158 is an output of the relaxed encoding mechanism 152 based on encoding the content data 108 utilizing the polarization limit 156. The relaxed code word 158 can be similar to or different from the polar code output of the polar encoding mechanism 128 based on the polarization limit 156. The computing system 100 can generate the transmitter signal 114 based on the relaxed code word 158 for the relaxed communication mechanism 142.

The relaxed decoding mechanism 154 is a method, a process, or a combination thereof for decoding information for the linear block error correcting code based on transforming bit channels based on utilizing limits on processes. The relaxed decoding mechanism 154 can be similar to the polar decoding mechanism 130. The relaxed decoding mechanism 154 can utilize the polar decoding mechanism 130 utilizing the relaxed coding profile 144 to limit the polar decoding mechanism 130 to process the content data 108.

For example, the relaxed decoding mechanism 154 can utilize a likelihood limit 160. The likelihood limit 160 is given by the polar-processing range 146 specific for utilizing the polar decoding mechanism 130 for the relaxed decoding mechanism 154. The likelihood limit 160 can limit the likelihood calculation 134 for the relaxed decoding mechanism 154, or provide condition for switching between different likelihood calculations 134 corresponding to different channel polarization elements.

The relaxed decoding mechanism 154 can generate a relaxed likelihood result 162. The relaxed likelihood result 162 is an output of the relaxed decoding mechanism 154 based on decoding the receiver signal 116 utilizing the likelihood limit 160. The relaxed likelihood result 162 can be similar to or different from the likelihood output of the polar decoding mechanism 130 based on the likelihood limit 160. The computing system 100 can decode the receiver signal 116 for the content data 108 based on the relaxed decoding mechanism 154 for the relaxed communication mechanism 142.

The computing system 100 can further include or utilize communication rate 164, channel capacity 166, error rate 168, or a combination thereof for communicating the content data 108. The communication rate 164 can include a description of speed or a quantity over time for communicating information for the computing system 100. The communication rate 164 can represent a speed or a rate for communicating between the first device 102 and the second device 106. The communication rate 164 can further be for communicating the content data 108 based on the relaxed communication mechanism 142 or the polar processing mechanism 126.

The channel capacity 166 can include capability, quantity, availability, applicability, or a combination thereof for the communication channel 118. The channel capacity 166 can represent capability of the communication channel 118, available or applicable instances of the bit channel 120, maximum amount or quantity of information available for the communication channel 118, or a combination thereof.

The error rate 168 can include an amount of error or failure in communicating between devices for the computing system 100. The error rate 168 can be for processing the content data 108 between the first device 102 and the second device 106. The error rate 168 can further include an error rate for a unit or a grouping of information, such as a frame error rate.

Figure 2:
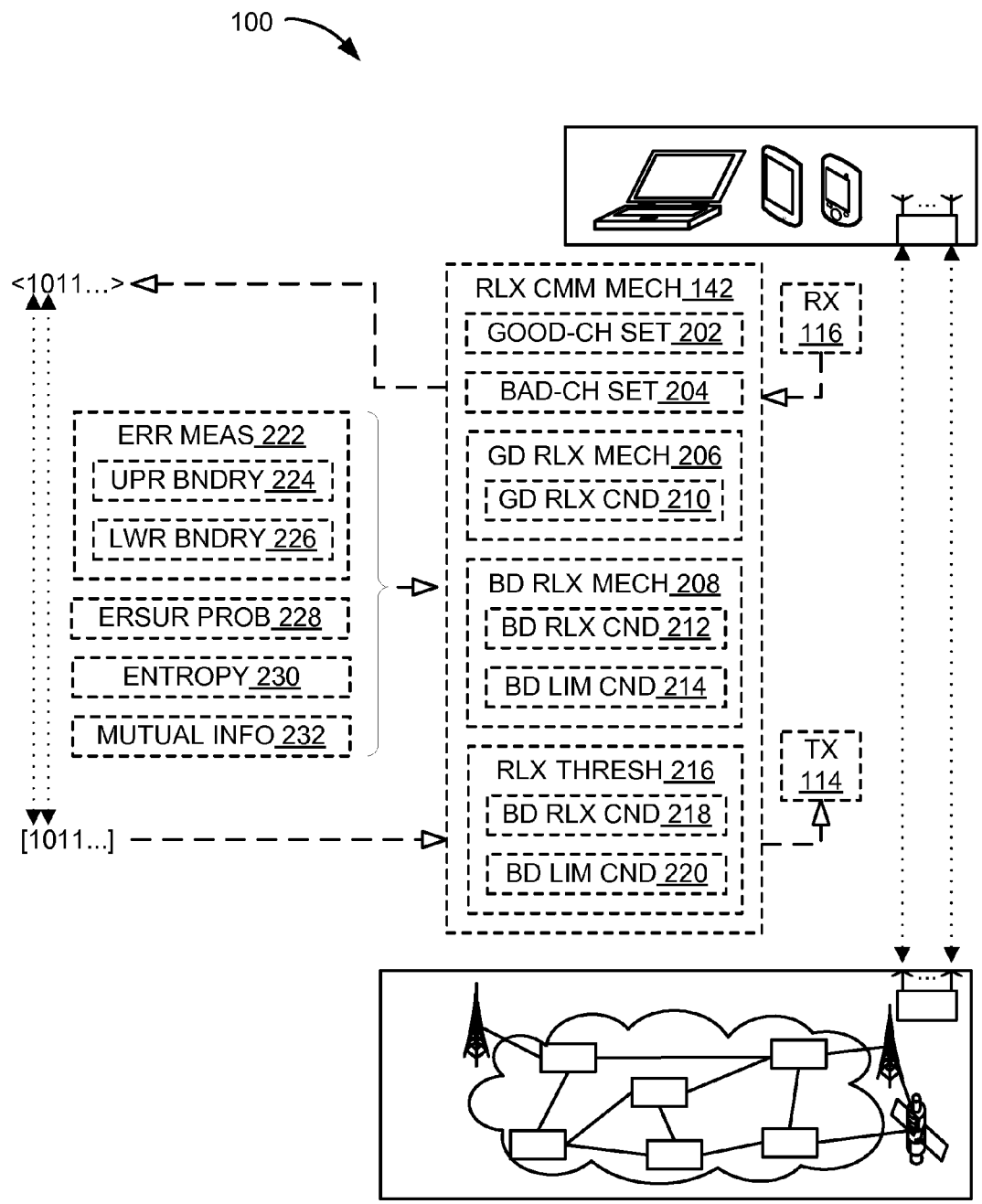
FIG. 2 is an exemplary configuration for the computing system.

Referring now to FIG. 2, therein is shown an exemplary configuration for the computing system 100. The computing system 100 can include the relaxed communication mechanism 142 including a good-channel set 202, a bad-channel set 204, or a combination thereof.

The good-channel set 202 can include a grouping or an identification of instances of the good bit-channel 122 of FIG. 1 for the computing system 100. The good-channel set 202 can include the instances of the good bit-channel 122 resulting from the channel polarization 132 of FIG. 1 implemented by the relaxed communication mechanism 142. The good-channel set 202 can be represented as 'Γ'.

The bad-channel set 204 can include a grouping or an identification of instances of the bad bit-channel 124 of FIG. 1 for the computing system 100. The bad-channel set 204 can include the instances of the bad bit-channel 124 resulting from the channel polarization 132 implemented by the relaxed communication mechanism 142.

The computing system 100 can utilize the relaxed communication mechanism 142 including a good-channel relaxation mechanism 206, a bad-channel relaxation mechanism 208, or a combination thereof. The computing system 100 can utilize the relaxed communication mechanism 142 utilizing both the good-channel relaxation mechanism 206 and the bad-channel relaxation mechanism 208 for an all-channel relaxed polarization.

The good-channel relaxation mechanism 206 is a method, a process, or a combination thereof for providing linear block error correcting code based on transforming bit channels and based on utilizing limits on processes associated with the good bit-channel 122. The good-channel relaxation mechanism 206 can include the relaxed encoding mechanism 152 of FIG. 1, the relaxed decoding mechanism 154 of FIG. 1, or a combination thereof corresponding to the good bit-channel 122 or the good-channel set 202. The good-channel relaxation mechanism 206 can further include good-channel relaxed polarization (GC-RP).

The bad-channel relaxation mechanism 208 is a method, a process, or a combination thereof for providing linear block error correcting code based on transforming bit channels and based on utilizing limits on processes associated with the bad bit-channel 124. The bad-channel relaxation mechanism 208 can include the relaxed encoding mechanism 152, the relaxed decoding mechanism 154, or a combination thereof corresponding to the bad bit-channel 124 or the bad-channel set 204. The bad-channel relaxation mechanism 208 can further include bad-channel relaxed polarization (BC-RP).

The good-channel relaxation mechanism 206 can include a good-channel relaxation condition 210. The good-channel relaxation condition 210 is a circumstance or a situation for limiting a process for an instance of the bit channel 120 according to the good-channel relaxation mechanism 206.

The good-channel relaxation condition 210 can be for stopping the channel polarization 132, the polar encoding mechanism 128, the likelihood calculation 134, or a combination thereof beyond a processing level. For example, the good-channel relaxation condition 210 can be associated with the polar-processing range 146 of FIG. 1, such as the polarization limit 156 of FIG. 1, the likelihood limit 160 of FIG. 1, or a combination thereof for processing the good bit-channel 122 or the good-channel set 202.

The bad-channel relaxation mechanism 208 can include a bad-channel relaxation condition 212, a bad-channel limiting condition 214, or a combination thereof. The bad-channel relaxation condition 212 is a circumstance or a situation for limiting a process for an instance of the bit channel 120 according to the bad-channel relaxation mechanism 208.

The bad-channel relaxation condition 212 can be for stopping the channel polarization 132, the polar encoding mechanism 128, the likelihood calculation 134, or a combination thereof beyond a processing level. For example, the bad-channel relaxation condition 212 can be associated with the polar-processing range 146, such as the polarization limit 156, the likelihood limit 160, or a combination thereof for processing the bad bit-channel 124 or the bad-channel set 204.

The bad-channel limiting condition 214 is a circumstance or a situation for initiating implementation of the bad-channel relaxation mechanism 208 or a portion therein. For example, the bad-channel limiting condition 214 can include the circumstance or the requirement as an initial requirement or condition required for implementing the bad-channel relaxation mechanism 208. As a more specific example, the bad-channel limiting condition 214 can be based on a target processing or polarization level, the total polarization level 140 of FIG. 1, the good-channel relaxation condition 210, the bad-channel relaxation condition 212, the good-channel relaxation mechanism 206, the bad-channel relaxation mechanism 208, or a combination thereof.

The computing system 100 can utilize the relaxed communication mechanism 142 based on a relaxation range 216. The relaxation range 216 is one or a set of control parameters for controlling or limiting implementation of the relaxed communication mechanism 142. The relaxation range 216 can include one or a set of thresholds.

The computing system 100 can calculate the relaxation range 216 as a value based on various conditions or input values. The relaxation range 216 can be for implementing the good-channel relaxation condition 210, the bad-channel relaxation condition 212, the bad-channel limiting condition 214, or a combination thereof.

The relaxation range 216 can include a good-channel range 218, a bad-channel range 220, or a combination thereof. The good-channel range 218 is one or a set of control parameters utilized for evaluating the good bit-channel 122 or the good-channel set 202 in implementing the relaxed communication mechanism 142. The bad-channel range 220 is one or a set of control parameters utilized for evaluating the bad bit-channel 124 or the bad-channel set 204 in implementing the relaxed communication mechanism 142. The computing system 100 can implement the polar-processing range 146 based on the good-channel range 218, the bad-channel range 220, or a combination thereof.

For example, the good-channel relaxation condition 210 can be based on using the good-channel range 218 as a test condition for implementing or limiting the channel polarization 132, the likelihood calculation 134, or a combination thereof for the good bit-channel 122 or the good-channel set 202. Also for example, the bad-channel relaxation condition 212 can be based on using the bad-channel range 220 as a test condition for implementing or limiting the channel polarization 132, the likelihood calculation 134, or a combination thereof for the bad bit-channel 124 or the bad-channel set 204.

The computing system 100 can further utilize an error measure 222, an upper measure boundary 224, a lower measure boundary 226, an erasure probability 228, an entropy function 230, a mutual information 232, or a combination thereof for the relaxed communication mechanism 142. The error measure 222 can include a probability or a likelihood of error associated with a specific instance of the bit channel 120.

For example, the error measure 222 can be a calculated value representing a probability or a likelihood that a bit intended for communication to a device is not a bit resulting at the receiving device. As a more specific example, the error measure 222 can be numerically calculated using simulations or schemes, such as Monte-Carlo, for the short block 112 of FIG. 1.

Also for example, the error measure 222 can include the upper measure boundary and the lower measure boundary 226. The upper measure boundary 224 and the lower measure boundary 226 can represent limitations or confidence range for the error measure 222. The computing system 100 can calculate the upper measure boundary 224 and the lower measure boundary 226 based on degrading and upgrading quantizations of the bit channel 120, respectively.

The error measure 222 can be a value estimated to be in a range represented by the upper measure boundary 224 and the lower measure boundary 226. The error measure 222 and a relationship with the upper measure boundary 224 and the lower measure boundary 226 can be represented as:

$$\underline{P}_{t,j} \leq P_{t,j} \leq \overline{P}_{t,j}.\qquad\text{Equation (2).}$$

The term 't' can represent a specific instance of a processing level or a polarization level currently considered or analyzed. The term 'j' can represent a specific instance of the bit channel 120. For the 'j'th instance of the bit channel 120 at 't' the instance of the polarization level, the lower measure boundary 226 can be represented as '$\underline{P}_{t,j}$' and the upper measure boundary 224 can be represented as '$\overline{P}_{t,j}$'. The error measure 222 can be represented as '$P_{t,j}$'.

The erasure probability 228 can represent a probability that an intended receiver device does not receive a bit intended for communication. The erasure probability 228 can be based on characteristics or traits of processes, such as the relaxed encoding mechanism 152 or the relaxed decoding mechanism 154, the communication channel 118 of FIG. 1, or a combination thereof.

The entropy function 230 can include a method, a process, or a combination thereof for determining an average amount of information contained in each message communicated between devices. The entropy function 230 can be represented as 'H( )'.

The mutual information 232 can include a measure of mutual dependence between parameters. The mutual information 232 can be represented as 'I( )'.

The computing system 100 can implement the various mechanisms described above in various ways. For example, the computing system 100 can implement the relaxed communication mechanism 142, the relaxed encoding mechanism 152, the relaxed decoding mechanism 154, the channel polarization 132, the likelihood calculation 134, or a combination thereof using hardware, software, firmware, or a combination thereof. As a more specific example, the various mechanisms can be implemented using circuits, active or passive, gates, arrays, feedback loops, feed-forward loops, hardware connections, functions or function calls, instructions, equations, data manipulations, structures, addresses, or a combination thereof.

Figure 3:
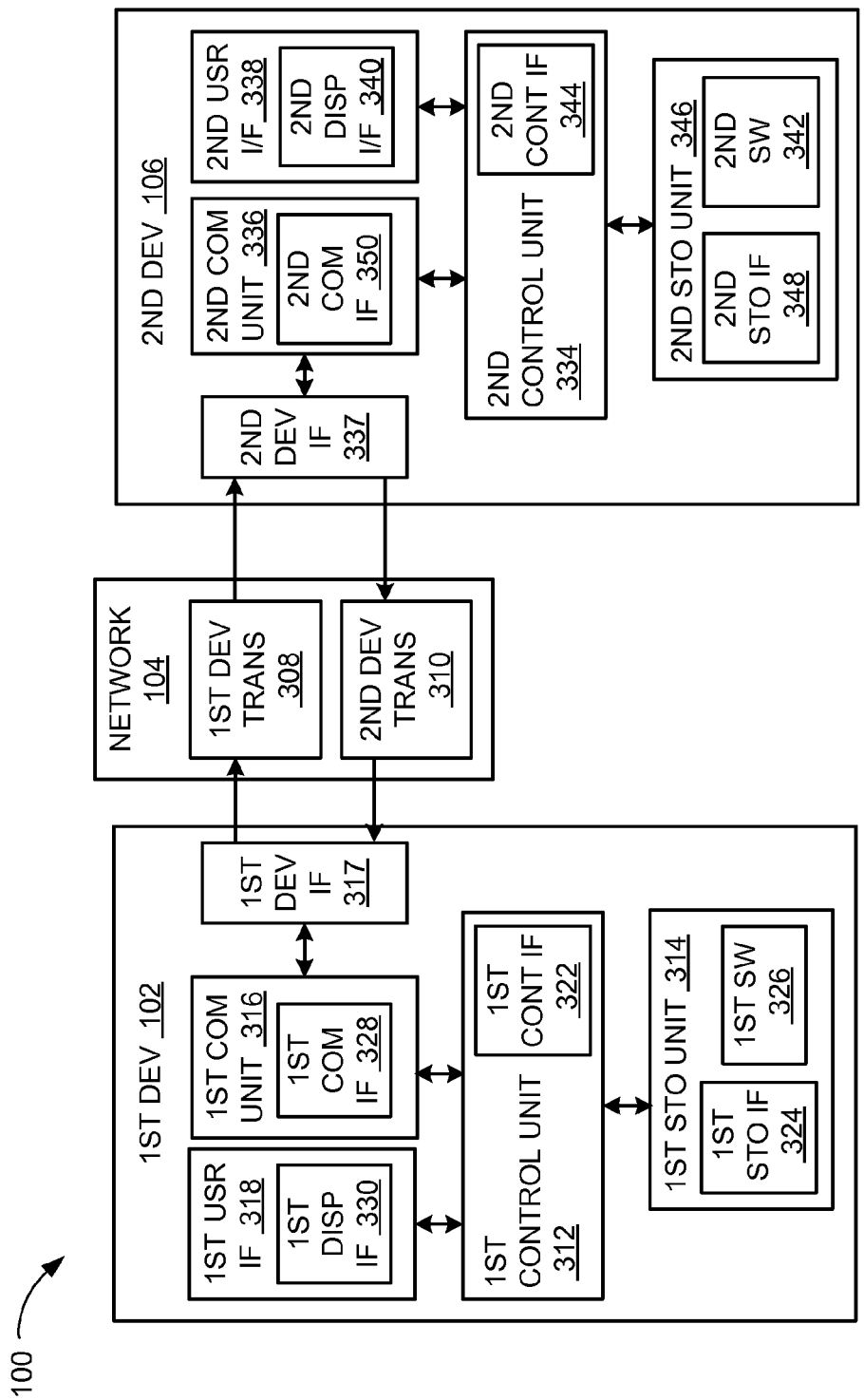
FIG. 3 is an exemplary block diagram of the computing system.

Referring now to FIG. 3, therein is shown an exemplary block diagram of the computing system 100. The computing system 100 can include the first device 102, the network 104, and the second device 106. The first device 102 can send information in a first device transmission 308 over the network 104 to the second device 106. The second device 106 can send information in a second device transmission 310 over the network 104 to the first device 102.

For illustrative purposes, the computing system 100 is shown with the first device 102 as a client device, although it is understood that the computing system 100 can have the first device 102 as a different type of device. For example, the first device 102 can be a server having a display interface.

Also for illustrative purposes, the computing system 100 is shown with the second device 106 as a server, although it is understood that the computing system 100 can have the second device 106 as a different type of device. For example, the second device 106 can be a client device.

For brevity of description in this embodiment of the present invention, the first device 102 will be described as a client device and the second device 106 will be described as a server device. The embodiment of the present invention is not limited to this selection for the type of devices. The selection is an example of an embodiment of the present invention.

The first device 102 can include a first control unit 312, a first storage unit 314, a first communication unit 316, and a first user interface 318. The first control unit 312 can include a first control interface 322. The first control unit 312 can execute a first software 326 to provide the intelligence of the computing system 100.

The first control unit 312 can be implemented in a number of different manners. For example, the first control unit 312 can be a processor, an application specific integrated circuit (ASIC) an embedded processor, a microprocessor, a hardware control logic, a hardware finite state machine (FSM), a digital signal processor (DSP), or a combination thereof. The first control interface 322 can be used for communication between the first control unit 312 and other functional units in the first device 102. The first control interface 322 can also be used for communication that is external to the first device 102.

The first control interface 322 can receive information from the other functional units or from external sources, or can transmit information to the other functional units or to external destinations. The external sources and the external destinations refer to sources and destinations external to the first device 102.

The first control interface 322 can be implemented in different ways and can include different implementations depending on which functional units or external units are being interfaced with the first control interface 322. For example, the first control interface 322 can be implemented with a pressure sensor, an inertial sensor, a microelectromechanical system (MEMS), optical circuitry, waveguides, wireless circuitry, wireline circuitry, or a combination thereof.

The first storage unit 314 can store the first software 326. The first storage unit 314 can also store the relevant information, such as data representing incoming images, data representing previously presented image, sound files, or a combination thereof.

The first storage unit 314 can be a volatile memory, a nonvolatile memory, an internal memory, an external memory, or a combination thereof. For example, the first storage unit 314 can be a nonvolatile storage such as non-volatile random access memory (NVRAM), Flash memory, disk storage, or a volatile storage such as static random access memory (SRAM).

The first storage unit 314 can include a first storage interface 324. The first storage interface 324 can be used for communication between the first storage unit 314 and other functional units in the first device 102. The first storage interface 324 can also be used for communication that is external to the first device 102.

The first storage interface 324 can receive information from the other functional units or from external sources, or can transmit information to the other functional units or to external destinations. The external sources and the external destinations refer to sources and destinations external to the first device 102.

The first storage interface 324 can include different implementations depending on which functional units or external units are being interfaced with the first storage unit 314. The first storage interface 324 can be implemented with technologies and techniques similar to the implementation of the first control interface 322.

The first communication unit 316 can enable external communication to and from the first device 102. For example, the first communication unit 316 can permit the first device 102 to communicate with the second device 106, a different device, an attachment, such as a peripheral device or a desktop computer, the network 104, or a combination thereof.

The first communication unit 316 can also function as a communication hub allowing the first device 102 to function as part of the network 104 and not limited to be an end point or terminal unit to the network 104. The first communication unit 316 can include active and passive components, such as microelectronics or an antenna, for interaction with the network 104.

The first communication unit 316 can include a baseband device or component, a modem, a digital signal processor, or a combination thereof for transmitting, formatting, receiving, detecting, decoding, further processing, or a combination thereof for communication signals. The first communication unit 316 can include one or more portions for processing the voltages, the currents, the digital information, or a combination thereof, such as an analog-to-digital converter, a digital-to-analog converter, a filter, an amplifier, a processor-type circuitry, or a combination thereof. The first communication unit 316 can further include one or more portions for storing information, such as cache or RAM memory, registers, or a combination thereof.

The first communication unit 316 can be coupled with a first inter-device interface 317. The first inter-device interface 317 can be a device or a portion of a device for physically communicating signals with a separate device. The first inter-device interface 317 can communicate by transmitting or receiving signals to or from another device. The first inter-device interface 317 can include one or more antennas for wireless signals, a physical connection and receiver-transmitter for wired signals, or a combination thereof. The first inter-device interface 317 can include an omnidirectional antenna, a wire, an antenna chip, a ceramic antenna, or a combination thereof. The first inter-device interface 317 can further include a port, a wire, a repeater, a connector, a filter, a sensor, or a combination thereof.

The first inter-device interface 317 can detect or respond to a power in electromagnetic waves and provide the detected result to the first communication unit 316 to receive a signal, including the second device transmission 310. The first inter-device interface 317 can provide a path or respond to currents or voltages provided by the first communication unit 316 to transmit a signal, including the first device transmission 308.

The first communication unit 316 can include a first communication interface 328. The first communication interface 328 can be used for communication between the first communication unit 316 and other functional units in the first device 102. The first communication interface 328 can receive information from the other functional units or can transmit information to the other functional units.

The first communication interface 328 can include different implementations depending on which functional units are being interfaced with the first communication unit 316. The first communication interface 328 can be implemented with technologies and techniques similar to the implementation of the first control interface 322.

The first user interface 318 allows a user (not shown) to interface and interact with the first device 102. The first user interface 318 can include an input device and an output device. Examples of the input device of the first user interface 318 can include a keypad, a touchpad, soft-keys, a keyboard, a microphone, an infrared sensor for receiving remote signals, or any combination thereof to provide data and communication inputs.

The first user interface 318 can include a first display interface 330. The first display interface 330 can include an output device. The first display interface 330 can include a display, a projector, a video screen, a speaker, or any combination thereof.

The first control unit 312 can operate the first user interface 318 to display information generated by the computing system 100. The first control unit 312 can also execute the first software 326 for the other functions of the computing system 100. The first control unit 312 can further execute the first software 326 for interaction with the network 104 via the first communication unit 316.

The second device 106 can be optimized for implementing an embodiment of the present invention in a multiple device embodiment with the first device 102. The second device 106 can provide the additional or higher performance processing power compared to the first device 102. The second device 106 can include a second control unit 334, a second communication unit 336, a second user interface 338, and a second storage unit 346.

The second user interface 338 allows a user (not shown) to interface and interact with the second device 106. The second user interface 338 can include an input device and an output device. Examples of the input device of the second user interface 338 can include a keypad, a touchpad, soft-keys, a keyboard, a microphone, or any combination thereof to provide data and communication inputs. Examples of the output device of the second user interface 338 can include a second display interface 340. The second display interface 340 can include a display, a projector, a video screen, a speaker, or any combination thereof.

The second control unit 334 can execute a second software 342 to provide the intelligence of the second device 106 of the computing system 100. The second software 342 can operate in conjunction with the first software 326. The second control unit 334 can provide additional performance compared to the first control unit 312.

The second control unit 334 can operate the second user interface 338 to display information. The second control unit 334 can also execute the second software 342 for the other functions of the computing system 100, including operating the second communication unit 336 to communicate with the first device 102 over the network 104.

The second control unit 334 can be implemented in a number of different manners. For example, the second control unit 334 can be a processor, an embedded processor, a microprocessor, hardware control logic, a hardware finite state machine (FSM), a digital signal processor (DSP), or a combination thereof.

The second control unit 334 can include a second control interface 344. The second control interface 344 can be used for communication between the second control unit 334 and other functional units in the second device 106. The second control interface 344 can also be used for communication that is external to the second device 106.

The second control interface 344 can receive information from the other functional units or from external sources, or can transmit information to the other functional units or to external destinations. The external sources and the external destinations refer to sources and destinations external to the second device 106.

The second control interface 344 can be implemented in different ways and can include different implementations depending on which functional units or external units are being interfaced with the second control interface 344. For example, the second control interface 344 can be implemented with a pressure sensor, an inertial sensor, a microelectromechanical system (MEMS), optical circuitry, waveguides, wireless circuitry, wireline circuitry, or a combination thereof.

A second storage unit 346 can store the second software 342. The second storage unit 346 can also store the information such as data representing incoming images, data representing previously presented image, sound files, or a combination thereof. The second storage unit 346 can be sized to provide the additional storage capacity to supplement the first storage unit 314.

For illustrative purposes, the second storage unit 346 is shown as a single element, although it is understood that the second storage unit 346 can be a distribution of storage elements. Also for illustrative purposes, the computing system 100 is shown with the second storage unit 346 as a single hierarchy storage system, although it is understood that the computing system 100 can have the second storage unit 346 in a different configuration. For example, the second storage unit 346 can be formed with different storage technologies forming a memory hierarchal system including different levels of caching, main memory, rotating media, or off-line storage.

The second storage unit 346 can be a volatile memory, a nonvolatile memory, an internal memory, an external memory, or a combination thereof. For example, the second storage unit 346 can be a nonvolatile storage such as non-volatile random access memory (NVRAM), Flash memory, disk storage, or a volatile storage such as static random access memory (SRAM).

The second storage unit 346 can include a second storage interface 348. The second storage interface 348 can be used for communication between the second storage unit 346 and other functional units in the second device 106. The second storage interface 348 can also be used for communication that is external to the second device 106.

The second storage interface 348 can receive information from the other functional units or from external sources, or can transmit information to the other functional units or to external destinations. The external sources and the external destinations refer to sources and destinations external to the second device 106.

The second storage interface 348 can include different implementations depending on which functional units or external units are being interfaced with the second storage unit 346. The second storage interface 348 can be implemented with technologies and techniques similar to the implementation of the second control interface 344.

The second communication unit 336 can enable external communication to and from the second device 106. For example, the second communication unit 336 can permit the second device 106 to communicate with the first device 102 over the network 104.

The second communication unit 336 can also function as a communication hub allowing the second device 106 to function as part of the network 104 and not limited to be an end point or terminal unit to the network 104. The second communication unit 336 can include active and passive components, such as microelectronics or resistors, for interaction with the network 104.

The second communication unit 336 can include a baseband device or component, a modem, a digital signal processor, or a combination thereof for transmitting, formatting, receiving, detecting, decoding, further processing, or a combination thereof for communication signals. The second communication unit 336 can include one or more portions for processing the voltages, the currents, the digital information, or a combination thereof, such as an analog-to-digital converter, a digital-to-analog converter, a filter, an amplifier, a processor-type circuitry, or a combination thereof. The second communication unit 336 can further include one or more portions for storing information, such as cache or RAM memory, registers, or a combination thereof.

The second communication unit 336 can be coupled with a second inter-device interface 337. The second inter-device interface 337 can be a device or a portion of a device for physically communicating signals with a separate device. The second inter-device interface 337 can communicate by transmitting or receiving signals to or from another device. The second inter-device interface 337 can include one or more antennas for wireless signals, a physical connection and receiver-transmitter for wired signals, or a combination thereof. The second inter-device interface 337 can include an omnidirectional antenna, a wire, an antenna chip, a ceramic antenna, or a combination thereof. The second inter-device interface 337 can further include a port, a wire, a repeater, a connector, a filter, a sensor, or a combination thereof.

The second inter-device interface 337 can detect or respond to a power in electromagnetic waves and provide the detected result to the second communication unit 336 to receive a signal, including the first device transmission 308. The second inter-device interface 337 can provide a path or respond to currents or voltages provided by the second communication unit 336 to transmit a signal, including the second device transmission 310.

The second communication unit 336 can include a second communication interface 350. The second communication interface 350 can be used for communication between the second communication unit 336 and other functional units in the second device 106. The second communication interface 350 can receive information from the other functional units or can transmit information to the other functional units.

The second communication interface 350 can include different implementations depending on which functional units are being interfaced with the second communication unit 336. The second communication interface 350 can be implemented with technologies and techniques similar to the implementation of the second control interface 344.

The first communication unit 316 can couple with the network 104 to send information to the second device 106 in the first device transmission 308. The second device 106 can receive information in the second communication unit 336 from the first device transmission 308 of the network 104.

The second communication unit 336 can couple with the network 104 to send information to the first device 102 in the second device transmission 310. The first device 102 can receive information in the first communication unit 316 from the second device transmission 310 of the network 104. The computing system 100 can be executed by the first control unit 312, the second control unit 334, or a combination thereof. For illustrative purposes, the second device 106 is shown with the partition having the second user interface 338, the second storage unit 346, the second control unit 334, and the second communication unit 336, although it is understood that the second device 106 can have a different partition. For example, the second software 342 can be partitioned differently such that some or all of its function can be in the second control unit 334 and the second communication unit 336. Also, the second device 106 can include other functional units not shown in FIG. 3 for clarity.

The functional units in the first device 102 can work individually and independently of the other functional units. The first device 102 can work individually and independently from the second device 106 and the network 104.

The functional units in the second device 106 can work individually and independently of the other functional units. The second device 106 can work individually and independently from the first device 102 and the network 104.

The functional units described above can be implemented in hardware. For example, one or more of the functional units can be implemented using the a gate, circuitry, a processor, a computer, integrated circuit, integrated circuit cores, a pressure sensor, an inertial sensor, a microelectromechanical system (MEMS), a passive device, a physical non-transitory memory medium having instructions for performing the software function, a portion therein, or a combination thereof.

For illustrative purposes, the computing system 100 is described by operation of the first device 102 and the second device 106. It is understood that the first device 102 and the second device 106 can operate any of the modules and functions of the computing system 100.

Figure 4:
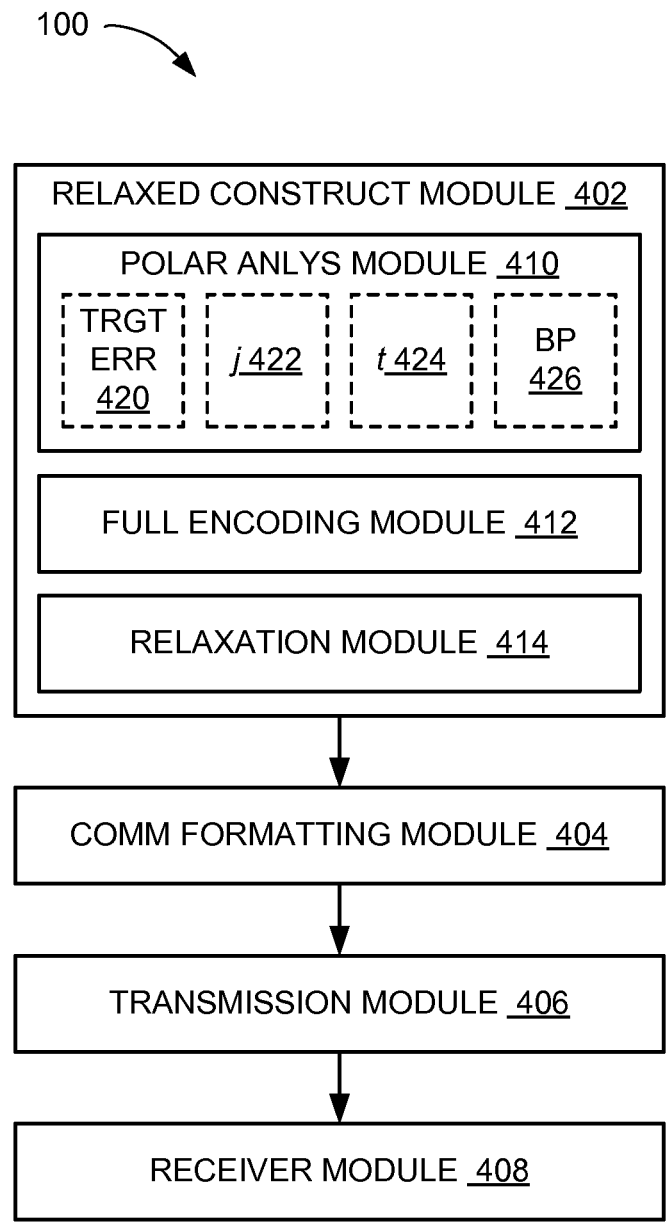
FIG. 4 is a control flow of the computing system.

Referring now to FIG. 4, therein is shown a control flow of the computing system 100. The computing system 100 can include a relaxed construction module 402, a communication formatting module 404, a transmission module 406, a receiver module 408, or a combination thereof.

The relaxed construction module 402 can be coupled with the communication formatting module 404, which can be further coupled with the transmission module 406. The transmission module 406 can be coupled with the receiver module 408.

The modules can be coupled to each other in a variety of ways. For example, modules can be coupled by having the input of one module connected to the output of another, such as by using wired or wireless connections, the network 104 of FIG. 1, instructional steps, process sequence, or a combination thereof. Also for example, the modules can be coupled either directly with no intervening structure other than connection means between the directly coupled modules, or indirectly with modules or devices other than the connection means between the indirectly coupled modules.

As a more specific example, one or more inputs or outputs of the relaxed construction module 402 can be connected to one or more inputs or inputs of the communication formatting module 404 using conductors or the transmission channel without intervening modules or devices there-between. Also for example, the relaxed construction module 402 and the communication formatting module 404 can be coupled through the network 104, a backhaul channel between base stations or the coordinating device, the coordinating device, or a combination thereof. Also for example, the transmission module 406 can be coupled with the receiver module 408 directly or indirectly, such as through the network 104, the communication channel 118 of FIG. 1, or a combination thereof. The relaxed construction module 402, the communication formatting module 404, the transmission module 406, the receiver module 408, or a combination thereof can be coupled directly or indirectly as exemplified above similar ways.

The computing system 100 can communicate with or using a device, such as by displaying images, recreating sounds, exchanging process steps or instructions, or a combination thereof. The computing system 100 can communicate information between devices. The receiving device can further communicate with the user by displaying images, recreating sounds, exchanging process steps or instructions, or a combination thereof according to the information communicate to the device.

The relaxed construction module 402 is configured to determine control parameters for implementing the relaxed communication mechanism 142 of FIG. 1. The relaxed construction module 402 can determine the relaxed coding profile 144 of FIG. 1 for implementing the relaxed communication mechanism 142 to exchange and process the content data 108 of FIG. 1 between devices, such as between the first device 102 of FIG. 1 and the second device 106 of FIG. 1.

For example, the relaxed construction module 402 can generate the relaxed coding profile 144, the polar-processing range 146 of FIG. 1 therein, including the polarization limit 156 of FIG. 1, the likelihood limit 160 of FIG. 1, or a combination thereof. The relaxed construction module 402 can generate the relaxed coding profile 144 or parameters therein for communicating and processing the content data 108 over the communication channel 118 of FIG. 1 or one or more instances of the bit channel 120 of FIG. 1. The relaxed construction module 402 can include a polar analysis module 410, a full encoding module 412, a relaxation module 414, or a combination thereof.

The relaxed construction module 402 can generate the relaxed coding profile 144 based on a target error 420. The target error 420 is a desired or limiting instance of the error rate 168 of FIG. 1. The target error 420 can be selected or identified for establishing and executing successful communication of the content data 108. The computing system 100 can determine or identify the target error 420 based on a list, a method, a process, or a combination thereof predetermined by the computing system 100, a communication standard, or a combination thereof. The target error 420 can be represented as 'E'.

The relaxed construction module 402 can analyze each instance of the polarization or processing level up to the total polarization level 140 of FIG. 1 for fully polarized polar code of the polar code length 138 of FIG. 1 corresponding to the total polarization level 140, each instance of the bit channel 120 for the communication channel 118, or a combination thereof. The relaxed construction module 402 can iteratively analyze each processing or polarization level using a subject polarization level 424 representing an index for identifying a level of the channel polarization 132 of FIG. 1. The subject polarization level 424 can be represented as 't'. As a more specific example, the subject polarization level 424 can be an integer between 1 and the total polarization level 140, such as represented by '$1 \leq t \leq n$'.

The relaxed construction module 402 can iteratively analyze each instance of the bit channel 120 using a subject channel index 422 representing an index for identifying a specific instance of the bit channel 120 for communicating the content data 108. The subject polarization level 424 can be represented as 'j'. As a more specific example, the subject channel index 422 can be an integer between 1 and the subject polarization level 424, the total polarization level 140, or a combination thereof, such as represented by '$1 \leq j \leq 2^t$'.

The polar analysis module 410 is configured to assess the bit channel 120 for communicating the content data 108. The polar analysis module 410 can utilize or implement the polar processing mechanism 126 of FIG. 1 to assess one or a set of the bit channel 120.

For example, the polar analysis module 410 can utilize or implement the channel polarization 132 for fully polarized code of the polar code length 138 corresponding to the total polarization level 140. Also for example, the polar analysis module 410 can analyze all processing or polarization levels, all instances of the bit channel 120, or a combination thereof based on iteratively using the subject polarization level 424 ranging from 1 to the total polarization level 140, based on iteratively using instances of the bit channel 120 corresponding to the subject polarization level 424 ranging from 1 to '$2^t$', or a combination thereof.

The polar analysis module 410 can determine the error measure 222 of FIG. 2 corresponding to the bit channel 120 for the polar processing mechanism 126 associated with the fully polarized code. The polar analysis module 410 can determine the error measure 222 by calculating the upper measure boundary 224 of FIG. 2, the lower measure boundary 226 of FIG. 2, or a combination thereof representing the error measure 222. The polar analysis module 410 can further determine the error measure 222 by directly calculating the error measure 222.

The polar analysis module 410 can calculate the upper measure boundary 224 using degraded channel, such as corresponding to the bad bit-channel 124 of FIG. 1, for the fully polarized polar code on the bit channel 120 with the channel capacity 166 of FIG. 1 represented as 'C'. The polar analysis module 410 can similarly calculate the lower measure boundary 226 using upgraded channel, such as corresponding to the bad bit-channel 124 of FIG. 1, for the fully polarized polar code on the bit channel 120 with the channel capacity 166.

The polar analysis module 410 can further directly calculate the error measure 222. The polar analysis module 410 can numerically calculate the error measure 222 for representing the bit channel 120 when the content data 108 corresponds to the short block 112 of FIG. 1. For example, the polar analysis module 410 can directly calculate the error measure 222 using Monte-Carlo simulations.

The polar analysis module 410 can set the upper measure boundary 224 and the lower measure boundary 226 to be same as the directly calculated instance of the error measure 222, such as represented by '$\underline{P}_{t,j} = \overline{P}_{t,j} = \tilde{P}_{t,j}$'. The directly calculated instance of the error measure 222 can be represented as '$\tilde{P}_{t,j}$'.

The polar analysis module 410 can select or identify the bit channel 120 according target instance of the communication rate 164 of FIG. 1, represented as 'R', such that the channel capacity 166 of FIG. 1 associated therewith is not less than the communication rate 164, satisfying '$C \geq R$'. The channel parameter, such as the error measure 222 or the boundaries associated therewith can be calculated based on the channel capacity 166, represented as 'C', such as for the binary input additive white Gaussian noise (AWGN) channel capacity.

The polar analysis module 410 can determine or calculate the error measure 222 or the boundaries associated therewith for erasure channels with the erasure probability 228 of FIG. 2. For erasure channels with the erasure probability 228, the polar analysis module 410 can determine or calculate the error measure 222 or the boundaries associated therewith based on the erasure probability 228.

The polar analysis module 410 can determine or calculate the error measure 222 or the boundaries associated therewith related to the target channel capacity according to '$\epsilon=1-C$'. The upper measure boundary 224 and the lower measure boundary 226 can coincide, and can be calculated based on Bhattacharya parameter 426, represented as '$Z(W)$'. For example, the upper measure boundary 224, the lower measure boundary 226, or a combination thereof can be calculated based on '$P_{t,j}=Z_{t,j}/2$'.

The Bhattacharya parameter 426 can represent a measurement of an unreliability of the channel. Instances of the channel or the bit channel 120 with the Bhattacharya parameter 426 close to zero can be the bit channel 120 that are noiseless and instances with the Bhattacharya parameter 426 close to 1 can be considered very noisy. The Bhattacharya parameter 426 of the 'j'th bit channel for the polar code length 138 'l' can be calculated recursively from those of a code of length 'l/2' through the recursive formulas, by denoting the 'j'th bit channel for a code of length 'l/2' by $W_{l/2}^j$, such that:

$$Z(W_l^{2i-1}) \le 2Z(W_{l/2}^i) - Z(W_{l/2}^i)^2,$$

$$Z(W_l^{2i}) = Z(W_{l/2}^i)^2. \quad \text{Equation (3).}$$

The polar analysis module 410 can further initialize the relaxed coding profile 144 including the relaxed map 148 of FIG. 1. For example, the polar analysis module 410 can initialize the relaxed map 148 to process every instance of the bit channel 120 to the total polarization level 140, such as for fully polarized coding. As a more specific example, the polar analysis module 410 can initialize the relaxed map 148 to include an integer value or a Boolean value for excluding any limitation, any stop processing flag, and any relaxation flag for all processing or polarization levels ranging from 1 to the total polarization level 140 and all corresponding instances of the bit channel 120.

The polar analysis module 410 can also initialize the upper measure boundary 224, the lower measure boundary 226, or a combination thereof for the relaxed communication mechanism 142 as the upper measure boundary 224, the lower measure boundary 226, or a combination thereof for the polar processing mechanism 126 for the fully polarized code. As a specific example, initialization for the polar analysis module 410 can be represented as 'Relaxed (t,j)=0, $\overline{P}_{t,j}^R = \overline{P}_{t,j}$'. The relaxed map 148 can be represented as 'Relaxed (t,j)', the upper measure boundary 224 for the relaxed communication mechanism 142 as '$\overline{P}_{t,j}^R$', and the upper measure boundary 224 for the fully polarized code as '$\overline{P}_{t,j}$'.

The polar analysis module 410 can use the first communication unit 316 of FIG. 3, the second communication unit 336 of FIG. 3, the first control unit 312 of FIG. 3, the second control unit 334 of FIG. 3, or a combination thereof to assess the bit channel 120, such as for calculating the error measure 222 or the boundaries associated therewith, initialization, or a combination thereof. The polar analysis module 410 can store the error measure 222 or the boundaries associated therewith, initialized instance of the relaxed coding profile 144, information regarding the bit channel 120, or a combination thereof in the first communication unit 316, the second communication unit 336, the first storage unit 314 of FIG. 3, the second storage unit 346 of FIG. 3, or a combination thereof. The polar analysis module 410 can further use the communication unit, the control unit, the storage unit, or a combination thereof corresponding to the coordinating device to assess the bit channel 120 or store associated processing results.

After assessing the bit channel 120, the control flow can pass to the full encoding module 412. The control flow can pass through a variety of ways. For example, control flow can pass by having processing results of one module passed to another module, such as by passing initialized instance of the relaxed coding profile 144, the error measure 222 or the boundaries associated therewith, or a combination thereof from the polar analysis module 410 to the full encoding module 412, by storing the processing results at a location known and accessible to the other module, such as by storing the initialized instance of the relaxed coding profile 144, the error measure 222 or the boundaries associated therewith, or a combination thereof at a storage location known and accessible to the full encoding module 412, by notifying the other module, such as by using a flag, an interrupt, a status signal, or a combination for the full encoding module 412, or a combination of processes thereof.

The full encoding module 412 is configured to construct the fully polarized code for the target error 420. The full encoding module 412 can construct the fully polarized code by sorting the instances of the bit channel 120, instances of the error measure 222 associated with each of the bit channel 120, instances of the upper measure boundary 224 associated with each of the bit channel 120, or a combination thereof. The full encoding module 412 can sort in any logical order, such as ascending or descending, as predetermined by the computing system 100 for the relaxed communication mechanism 142.

The full encoding module 412 can determine a set of the good bit-channel 122 of FIG. 1 within the sorted instances of the bit channel 120 for satisfying the target error 420. The full encoding module 412 can determine the set by testing a combination of lowest instances of the error measure 222 or the upper measure boundary 224 associated with instances of the good bit-channel 122 using the target error 420.

For example, the full encoding module 412 can determine the set as the grouping of the good bit-channel 122 with the combination of the error measure 222 or the upper measure boundary 224 less than or not exceeding the target error 420. Also for example, the full encoding module 412 can determine the set of the good bit-channel 122 according to:

$$\Sigma_{j \in \Gamma} \overline{P}_{n,j} \le E. \quad \text{Equation (4).}$$

The full encoding module 412 can determine the set of the good bit-channel 122 satisfying Equation (4) at the final polarization level for the channel polarization 132.

The full encoding module 412 can determine the good-channel set 202 of FIG. 2 as the set of the good bit-channel 122 satisfying the target error 420. The good-channel set 202 can be represented as 'Γ'. The fully polarized code can be defined by the good-channel set 202. The full encoding module 412 can determine the bad-channel set 204 as instances of the bad bit-channel 124 corresponding to instances of the good bit-channel 122 in the good-channel set 202. The full encoding module 412 can determine or identify the communication rate 164 for the fully polarized code as '$R=|\Gamma|/l$'.

The full encoding module 412 can use the first communication unit 316, the second communication unit 336, the first control unit 312, the second control unit 334, or a combination thereof to construct the fully polarized code, such as for sorting, determining, identifying, or a combination of processes thereof. The full encoding module 412 can store the good-channel set 202 or any other results for the fully polarized code in the first communication unit 316, the second communication unit 336, the first storage unit 314, the second storage unit 346, or a combination thereof. The full encoding module 412 can further use the communication unit, the control unit, the storage unit, or a combination thereof corresponding to the coordinating device to construct the fully polarized code or store associated processing results.

After constructing the fully polarized code, the control flow can be passed from the full encoding module 412 to the relaxation module 414. The control flow can pass similarly as described above between the polar analysis module 410 and the relaxation module 414 but using processing results of the encoding module 604, such as the good-channel set 202.

The relaxation module 414 is configured to generate the relaxed coding profile 144 for the relaxed communication mechanism 142. The relaxation module 414 can generate the relaxed coding profile 144 based on the fully polarized code, the good-channel set 202, the communication rate 164, the error measure 222 or the associated boundary, or a combination thereof.

For example, the relaxation module 414 can generate the relaxed coding profile 144 including the relaxed map 148, the relaxed channel information 150 of FIG. 1, the polar-processing range 146. Also for example, the relaxation module 414 can generate the relaxed coding profile 144 for implementing the relaxed encoding mechanism 152 of FIG. 1, the relaxed decoding mechanism 154 of FIG. 1, or a combination thereof.

The relaxation module 414 can generate the relaxed coding profile 144 based on calculating the relaxation range 216 of FIG. 2. The relaxation module 414 can calculate the relaxation range 216 corresponding to the relaxed coding profile 144 for evaluating the polar processing mechanism 126 for the bit channel 120.

The relaxation module 414 can calculate the relaxation range 216 for generating the relaxed coding profile 144. The relaxation module 414 can calculate the relaxation range 216 for evaluating the effectiveness or processing gain from implementing one or successive levels of polarization process within the polar processing mechanism 126, such as for the channel polarization 132 or the likelihood calculation 134, for each instance of the bit channel 120.

The relaxation module 414 can calculate the relaxation range 216 based on the target error 420, the communication rate 164, the polar code length 138, the total polarization level 140, or a combination thereof. The relaxation module 414 can further calculate the relaxation range 216 based on the entropy function 230 of FIG. 2.

For example, the relaxation module 414 can calculate the good-channel range 218 of FIG. 2 based on the target error 420, the communication rate 164, the polar code length 138, or a combination thereof. As a more specific example, the relaxation module 414 can calculate the good-channel range 218 according to:

$$E_g = \frac{E}{Rl}..$$
Equation (5)

The good-channel range 218 can be represented as '$E_g$'. The relaxation module 414 can calculate the good-channel range 218 for the good-channel relaxation mechanism 206 of FIG. 2.

Also for example, the relaxation module 414 can calculate the bad-channel range 220 of FIG. 2 based on the target error 420, the communication rate 164, the polar code length 138, the good-channel range 218, the entropy function 230, or a combination thereof. As a more specific example, the relaxation module 414 can calculate the bad-channel range 220 according to:

$$E_b = H^{-1}(1-H(E_g)).$$
Equation (6).

The bad-channel range 220 can be represented as '$E_b$'. The relaxation module 414 can calculate the bad-channel range 220 for the bad-channel relaxation mechanism 208 of FIG. 2. The term '$H(E_W)$' can represent entropy of the channel 'W' with fidelity '$E_W$' and is related to the channel capacity by '$I(W)=1-H(W)$'. For general binary memoryless symmetric channels 'W' with error probability '$E_W$', the approximation '$H(W) \approx h_2(E_W)$' can be used, based on '$H(W) \leq h_2(E_W)$', where '$h_2(\epsilon)=-\epsilon \log_2(\epsilon)-(1-e)\log_2(1-\epsilon)$' represents the binary entropy function.

The relaxation module 414 can further calculate the relaxation range 216 for the erasure channel. The relaxation module 414 can calculate the relaxation range 216 based on the erasure probability 228. For example, the relaxation module 414 can use the target error 420, represented as 'E', as half of the erasure probability 228, represented as '$\epsilon$', and '$H(E)=2E$'.

The relaxation module 414 can further generate the relaxed coding profile 144 by analyzing instances of the bit channel 120 for the relaxed communication mechanism 142. For example, the relaxation module 414 can analyze the instances of the bit channel 120 for all instances of the processing or polarization levels similar to the polar analysis module 410 described above. Also for example, the relaxation module 414 can iteratively use the subject polarization level 424 ranging from 1 to the total polarization level 140, instances of the bit channel 120 corresponding to the subject polarization level 424 ranging from 1 to '$2^i$', or a combination thereof to analyze the instances of the bit channel 120 for the relaxed communication mechanism 142.

The relaxation module 414 can test the good-channel relaxation condition 210 of FIG. 2 for the good-channel relaxation mechanism 206, test the bad-channel relaxation condition 212 of FIG. 2 for the bad-channel relaxation mechanism 208, or a combination thereof for each instance of the bit channel 120, for each processing or polarization level, or a combination thereof. The relaxation module 414 can test the various conditions by comparing the error rate 168 or the boundaries associated therewith for each instance of the bit channel 120, for each processing or polarization level, or a combination thereof to the relaxation range 216.

For example, the good-channel relaxation condition 210 can be when the upper measure boundary 224 or the error measure 222 for the bit channel 120 corresponding to a value of the subject polarization level 424 and a value of the subject channel index 422 is less than the good-channel range 218. As a more specific example, the good-channel relaxation condition 210 can be represented as '$\overline{P}_{t,j} < E_g$'.

Also for example, the bad-channel relaxation condition 212 can be when the lower measure boundary 226 or the error measure 222 for the bit channel 120 corresponding to a value of the subject polarization level 424 and a value of the subject channel index 422 is greater than the bad-channel range 220. As a more specific example, the bad-channel relaxation condition 212 can be represented as '$\underline{P}_{t,j} < E_b$'.

The relaxation module 414 can set or generate the polar-processing range 146, such as the polarization limit 156 or the likelihood limit 160, adjust the relaxed map 148, or a combination thereof based on testing the good-channel relaxation condition 210, the bad-channel relaxation condition 212, or a combination thereof. For example, the relaxation module 414 can set or generate the polar-processing range 146 as the processing level resulting in satisfying the good-channel relaxation condition 210, the bad-channel relaxation condition 212, or a combination thereof.

Also for example, the relaxation module 414 can adjust the relaxed map 148 by setting the polar-processing range 146, such as for an integer value or a Boolean value indicating halt for the channel polarization 132, the likelihood calculation 134 or a combination thereof, or switching to a different instance of the channel polarization 132, a different instance of the likelihood calculation 134 or a combination thereof, and associating with the subject polarization level 424, the subject channel index 422, or a combination thereof satisfying the good-channel relaxation condition 210, the bad-channel relaxation condition 212, or a combination thereof. As a more specific example, the relaxation module 414 can adjust the relaxed map 148 as 'Relaxed (t,j)=1' when '$\underline{P}_{t,j}<E_b$' or '$\overline{P}_{t,j}<E_g$'.

The relaxation module 414 can further set or generate the polar-processing range 146 for the bit channel 120 of subsequent processing or polarization levels following satisfaction of the good-channel relaxation condition 210, the bad-channel relaxation condition 212, or a combination thereof. For example, the relaxation module 414 can adjust the relaxed map 148 by setting the polar-processing range 146 and associating with instances of the subject polarization level 424, the subject channel index 422, or a combination thereof following, after, or above satisfaction the good-channel relaxation condition 210, the bad-channel relaxation condition 212, or a combination thereof. As a more specific example, the relaxation module 414 can adjust the relaxed map 148 as $$\text{'Relaxed }(t, j) = 1\text{' when 'Relaxed}\left(t-1, \left\lceil \frac{j}{2} \right\rceil\right) = 1\text{'}.$$

When the bad-channel relaxation condition 212 is satisfied, the relaxation module 414 can set or generate the polar-processing range 146 for relaxation based on verifying the lower measure boundary 226 of the best upgraded descendent channel of that node is higher than the good-channel range 218 '$E_g$'. It has been discovered that the verification of the lower measure boundary 226 for the best upgraded descendent channel of that node to be higher than the good-channel range 218 when the bad-channel relaxation condition 212 is satisfied prevents rate loss from implementing the bad-channel relaxation mechanism 208.

The relaxation module 414 can further assign the error measure 222 or boundaries associated therewith for instances of the bit channel 120 following satisfaction of satisfaction the good-channel relaxation condition 210, the bad-channel relaxation condition 212, or a combination thereof. For example, the relaxation module 414 can update the error measure 222 or boundaries associated therewith as $$\text{'}\overline{P}^R_{t,j} = \overline{P}^R_{t,\left\lceil \frac{j}{2} \right\rceil}\text{' when 'Relaxed}\left(t-1, \left\lceil \frac{j}{2} \right\rceil\right) = 1\text{'}.$$

The relaxation module 414 can dictate the relaxation of nodes or polarization process for the erasure channel directly based on the Bhattacharya parameter 426 of the node representing the processing or polarization level. For erasure channels, the Bhattacharya parameter 426 can be explicitly calculated based on Equation (3). The term '$Z_{i,t}=Z(\widetilde{W}_{2^t}^{(i)})$' can represent the Bhattacharya parameter 426 for the 'i'th instance of the bit channel 120 at polarization level 't'.

The construction for the relaxed communication mechanism 142 for the erasure channel at each polarization level 't=1:n' can be based on comparing the Bhattacharya parameter 426 to the relaxation range 216. For example, the good-channel relaxation condition 210 can include the Bhattacharya parameter 426 less than the good-channel range 218, the bad-channel relaxation condition 212 can include the Bhattacharya parameter 426 greater than the bad-channel range 220, or a combination thereof.

As a more specific example, the good-channel relaxation mechanism 206 can indicate or require that the bit channel 120 corresponding to the subject polarization level 424 and the subject channel index 422 not further be polarized, such as for the channel polarization 132 or the likelihood calculation 134, when the Bhattacharya parameter 426 of the bit channel 120 is less than the good-channel range 218. Also as a more specific example, the bad-channel relaxation mechanism 208 can indicate or require that the bit channel 120 corresponding to the subject polarization level 424 and the subject channel index 422 not further be polarized when the Bhattacharya parameter 426 of the bit channel 120 is greater than the bad-channel range 220.

Also as a more specific example, the relaxed communication mechanism 142 implementing both the good-channel relaxation mechanism 206 and the bad-channel relaxation mechanism 208 can indicate or require that the bit channel 120 not further be polarized when the Bhattacharya parameter 426 of the bit channel 120 is greater than the bad-channel range 220 or less than the good-channel range 218. The good-channel range 218 can be according to '$E_g=2E/l$', where '$E_g=1-E_b$' for the erasure channel.

The relaxation module 414 can further construct the relaxed code word 158 of FIG. 1 with the communication rate 164. The relaxation module 414 can sort the instances of the bit channel 120 according to the error measure 222 or the boundaries associated therewith for the relaxed communication mechanism 142 similarly as described in the full encoding module 412.

The relaxation module 414 can select or generate the good-channel set 202 for the relaxed communication mechanism 142 as the instances of the bit channel 120 corresponding to smallest or lowest instances of the error measure 222 or the boundaries associated therewith and satisfying the communication rate 164, the polar code length 138, or a combination thereof. For example, the relaxation module 414 can select or generate the good-channel set 202 to include 'Rl' instances of the bit channel 120 with smallest or lowest instances of the error measure 222, the upper measure boundary 224, the lower measure boundary 226, or a combination thereof.

The relaxation module 414 can select or generate the bad-channel set 204 as instances of the bad bit-channel 124 corresponding to the good bit-channel 122 included in the good-channel set 202. The relaxation module 414 can generate the relaxed channel information 150 as the good-channel set 202, the bad-channel set 204, or a combination thereof updated or generated for the relaxed communication mechanism 142.

The relaxation module 414 can further generate the relaxed coding profile 144 with or without the bad-channel relaxation condition 212. For example, the relaxation module 414 can generate the relaxed coding profile 144 corresponding to the good-channel relaxation mechanism 206 without corresponding to the bad-channel relaxation mechanism 208 by not utilizing or neglecting the bad-channel relaxation condition 212. The relaxation module 414 can generate the relaxed coding profile 144 based on satisfying the good-channel relaxation condition 210 only.

The relaxation module 414 can further generate the relaxed coding profile 144 based on the bad-channel limiting condition 214 of FIG. 2. The relaxation module 414 can generate the relaxed coding profile 144 based on ensuring that the bad-channel relaxation mechanism 208 is only implemented when the bad-channel limiting condition 214 is satisfied.

As a more specific example, the bad-channel limiting condition 214 can be based on the total polarization level 140, the good-channel range 218, the bad-channel range 220, or a combination thereof. Also as a mores specific example, the bad-channel limiting condition 214 can be according to $$`n-t \le \left\lceil \log\frac{\log E_g}{\log E_b} \right\rceil`.$$

It has been discovered that the relaxed coding profile 144 based on the bad-channel limiting condition 214 prevents rate loss from implementing the bad-channel relaxation mechanism 208.

It has been discovered that the relaxation range 216 based on the communication rate 164 and the target error 420 provides efficient communication of the content data 108. The relaxation range 216 based on the communication rate 164 and the target error 420 can be used to limit processing while ensuring the desired communication performance and metrics.

It has further been discovered that the relaxed coding profile 144 provides reduced computational and time complexity for implementing the polar coding scheme while maintaining the error rate 168 and the communication rate 164. The computing system 100 can use relaxed coding profile 144 including the polar-processing range 146, such as including the polarization limit 156 or the likelihood limit 160, the relaxed map 148, the relaxed channel information 150, or a combination thereof to limit less-productive processing of the content data 108 beyond a satisfactory point.

It has further been discovered that the relaxed coding profile 144 based on the relaxation range 216 and the error measure 222 provides increased battery life and decrease physical size requirements for implementation. The computing system 100 can use the error measure 222 directly calculated or represented by the upper measure boundary 224, the lower measure boundary 226, or a combination thereof and the relaxation range 216 to evaluate the bit channel 120 and processing gain associated with the bit channel 120. The computing system 100 can generate the relaxed coding profile 144 to efficiently balance the coding gain and the processing cost. The increased processing efficiency reduces number of operations, computing duration, required resources, required data storage, or a combination thereof, leading to decrease in power consumption and decrease in physical size requirements for the implementation.

It has further been discovered that the relaxed coding profile 144 based on the bad-channel limiting condition 214 provides coding gains while preventing rate loss from the bad-channel relaxation mechanism 208. The computing system 100 can use the bad-channel limiting condition 214 to identify and prevent conditions where limiting the channel polarization 132, the likelihood calculation 134, or a combination thereof for the bad bit-channel 124 results in rate loss for communicating the content data 108.

The relaxation module 414 can use the first communication unit 316, the second communication unit 336, the first control unit 312, the second control unit 334, or a combination thereof to generate the relaxed coding profile 144 as described or exemplified above. The relaxation module 414 can store the relaxed coding profile 144 or other processing results associated therewith in the first communication unit 316, the second communication unit 336, the first storage unit 314, the second storage unit 346, or a combination thereof.

The relaxation module 414 can further use the communication unit, the control unit, the storage unit, or a combination thereof corresponding to the coordinating device to process or store the relaxed coding profile 144 as described or exemplified above. The relaxed construction module 402 can implement the above described or exemplified processes using a base station or the coordination device, such as the second device 106, to determine the control parameters including the relaxed coding profile 144. The relaxed construction module 402 determine the control parameters off-line before communication of the content data 108 from a user, or in real-time based on or during communication of the content data 108 from the user.

After determining the control parameters, the control flow can be passed from the relaxed construction module 402 to the communication formatting module 404. The control flow can pass similarly as described above between the polar analysis module 410 and the relaxation module 414 but using processing results of the relaxed construction module 402, such as the good-channel set 202 for the relaxed communication mechanism 142, the relaxed coding profile 144, the relaxed code word 158, or a combination thereof.

The communication formatting module 404 is configured to communicate the relaxed coding profile 144. The communication formatting module 404 can determine the relaxed coding profile 144 for the first device 102, the second device 106, or a combination thereof by communicating the relaxed coding profile 144 to the first device 102, the second device 106, or a combination thereof. For example, the communication formatting module 404 can communicate the relaxed coding profile 144 from a base station to a UE or another base station.

Also for example, the communication formatting module 404 can communicate the relaxed coding profile 144 from a coordinating device to a base station, a UE, or a combination thereof. Also for example, the communication formatting module 404 can communicate the relaxed coding profile 144 between units or portions within one device, across multiple devices, or a combination thereof.

As a more specific example, the communication formatting module 404 can determine the relaxed coding profile 144 based on communicating the relaxed coding profile 144 generated by a base station or a coordinating device. The communication formatting module 404 can send and receive the relaxed coding profile 144 between the base station, the coordinating device, the UE, or a combination thereof, such as between the first device 102, the second device 106, the coordinating device, or a combination thereof.

The communication formatting module 404 can use the first device interface 317 of FIG. 3, the second device interface 337 of FIG. 3, or a combination thereof to communicate the relaxed coding profile 144. The communication formatting module 404 can further use an interface, such as the communication channel 118 or a backhaul channel, for the coordinating device or the base station to communicate the relaxed coding profile 144 to a UE or another base station. The communication formatting module 404 can store the relaxed coding profile 144 in the communication unit, the storage unit, or a combination thereof corresponding to the first device 102, the second device 106, the coordinating device, the base station, or a combination thereof.

The transmission module 406 is configured to communicate the content data 108. The transmission module 406 can process the content data 108, transmit the content data 108, or a combination thereof for communicating the content data 108.

The transmission module 406 can process the content data 108 based on the polar-processing range 146 less than the total polarization level 140 for the polar processing mechanism 126. The transmission module 406 can process the content data 108 based on utilizing the polar-processing range 146 for limiting the polar processing mechanism 126 corresponding to the bit channel 120 for the content data 108.

For example, the transmission module 406 can process the content data 108 for transmission over each instance of the bit channel 120 in the good-channel set 202, the bad-channel set 204, or a combination thereof. Also for example, the transmission module 406 can process the content data 108 based on encoding the content data 108. Also for example, the transmission module 406 can process the content data 108 based on utilizing the channel polarization 132 for the relaxed communication mechanism 142.

As a more specific example, the transmission module 406 can encode the content data 108 according to the relaxed encoding mechanism 152 including the polarization limit 156 limiting the channel polarization 132 in encoding the content data 108, or switching to a different instance or a value of the channel polarization 132 in encoding the content data 108. The transmission module 406 can process the content data 108 based on encoding with the good-channel relaxation mechanism 206, the bad-channel relaxation mechanism 208, or a combination thereof. The transmission module 406 can implement the channel polarization 132 for instances of the bit channel 120 based on the polar-processing range 146, the relaxed map 148, the relaxed channel information 150, or a combination thereof.

As a further specific example, the transmission module 406 can implement the channel polarization 132 for number of iterations or executions for one or more instance of the bit channel 120 up to the polar-processing range 146 associated with the relaxation range 216, the error measure 222 or the boundaries associated therewith, or a combination thereof according to the relaxed map 148, the relaxed channel information 150, or a combination thereof. The transmission module 406 can implement the channel polarization 132 for number of iterations or executions up to the polar-processing range 146 less than the total polarization level 140 for one or more instances of the bit channel 120 in the good-channel set 202, the bad-channel set 204, or a combination thereof.

The transmission module 406 can generate the relaxed code word 158 based on encoding the content data 108 according to the relaxed encoding mechanism 152 and the bit channel 120. The transmission module 406 can utilize the polar-processing range 146 resulted from evaluating the polar processing mechanism 126 for the bit channel 120. The transmission module 406 can implement the channel polarization 132 for the good bit-channel 122, the bad bit-channel 124, or a combination thereof up to a limit prescribed by the polar-processing range 146 resulted from evaluating the polar processing mechanism 126 for the bit channel 120.

The transmission module 406 can have prior knowledge of relaxed nodes and non-relaxed nodes for implementing the relaxed encoding mechanism 152 based on the relaxed coding profile 144. The transmission module 406 can further implement the relaxed communication mechanism 142 based on the polar-processing range 146 associated with the error measure 222.

For example, the transmission module 406 can generate the relaxed code word 158 from the content data 108 based on the polar-processing range 146, such as the polarization limit 156, resulting from processing the upper measure boundary 224, the lower measure boundary 226, or a combination thereof representing the error measure 222. Also for example, the transmission module 406 can generate the relaxed code word 158 from the content data 108 based on the polar-processing range 146 resulting from processing the error measure 222 directly calculated for representing the bit channel 120 when the content data 108 corresponds to the short block 112.

It has been discovered that the relaxed communication mechanism 142 limiting the channel polarization 132 based on the relaxed coding profile 144 provides reduced computational and time complexity for implementing the polar coding scheme while maintaining the error rate 168 and the communication rate 164. The reduction in iterations for the channel polarization 132 can provide the reduction in complexity. The relaxed coding profile 144 based on the relaxation range 216 specific for the channel condition for each instance of the bit channel 120, the communication rate 164, the error rate 168, or a combination thereof can prevent degradation in communication performance from limiting the channel polarization 132.

It has further been discovered that the relaxed encoding mechanism 152 processing the content data 108 using the relaxed coding profile 144 for the good-channel set 202 according to the good-channel relaxation mechanism 206 provides reduction in physical area and power for hardware implementation. It has been discovered that the relaxed encoding mechanism 152 processing the content data 108 using the relaxed coding profile 144 for the bad-channel set 204 according to the bad-channel relaxation mechanism 208 provides reduction in physical area and power for hardware implementation. The lower overall implementation of the channel polarization 132, the use of the polar-processing range 146, the relaxed map 148, the relaxed channel information 150, or a combination thereof pre-processed can provide the reduction in physical area and power for hardware implementation.

It has further been discovered that the relaxed encoding mechanism 152 including the good-channel relaxation mechanism 206 provides reduced processing complexity and lower bit-error rate. The computing system 100 can use the good-channel relaxation mechanism 206 to encode over the good bit-channel 122 only up to a point to ensure quality communication without over implementing the channel polarization 132.

It has further been discovered that the relaxed encoding mechanism 152 including the bad-channel relaxation mechanism 208 provides reduced processing complexity and lower bit-error rate. The computing system 100 can use the bad-channel relaxation mechanism 208 to encode over the bad bit-channel 124 only up to a point to ensure quality communication without over implementing the channel polarization 132.

The transmission module 406 can use the first communication unit 316, the second communication unit 336, the first control unit 312, the second control unit 334, or a combination thereof to implement the relaxed communication mechanism 142 and generate the relaxed code word 158. The transmission module 406 can store the relaxed code word 158 or other processing results in the first communication unit 316, the second communication unit 336, the first storage unit 314, the second storage unit 346, or a combination thereof.

The transmission module 406 can use the first device interface 317, the second device interface 337, or a combination thereof to communicate the content data 108. The transmission module 406 can transmit the transmitter signal 114 based on the relaxed code word 158 for communicating the content data 108. The transmission module 406 can generate energy, power, oscillation, or a combination thereof according to the relaxed code word 158 representing the content data 108 for transmitting the transmitter signal 114. The transmission module 406 can generate energy, power, oscillation, or a combination thereof using the transmission module 406 can generate energy, power, oscillation, or a combination thereof.

After processing and transmitting the content data 108, the control flow can be passed from the transmission module 406 to the receiver module 408. The control flow can pass similarly as described above between the polar analysis module 410 and the relaxation module 414 but using processing results of the transmission module 406, such as the transmitter signal 114.

The receiver module 408 is configured to receive and process the content data 108. The receiver module 408 can communicate the content data 108 by receiving the receiver signal 116 of FIG. 1 corresponding to the transmitter signal 114 for communicating the content data 108 over one or more instances of the bit channel 120.

The receiver module 408 can use the first device interface 317, the second device interface 337, or a combination thereof to communicate the content data 108. The receiver module 408 can receive the receiver signal 116 based on detecting or identifying energy, power, oscillation, or a combination thereof at the receiving device, including the first device 102. The receiver module 408 can store the detection or identification result in the first communication unit 316, the second communication unit 336, the first storage unit 314, the second storage unit 346, or a combination thereof.

The receiver module 408 can further process the receiver signal 116 to recover the content data 108 for communicating the content data 108 to the user through the receiving device or for executing the content data 108 at or through the receiving device. The receiver module 408 can process the receiver signal 116 to recover the content data 108 based on decoding the receiver signal 116.

The receiver module 408 can decode the receiver signal 116 to recover or estimate the content data 108 based on the relaxed decoding mechanism 154. The receiver module 408 can decode the receiver signal 116 based on the polar-processing range 146 less than the total polarization level 140 for the polar processing mechanism 126. The receiver module 408 can decode based on utilizing the polar-processing range 146 for limiting the polar processing mechanism 126 corresponding to the bit channel 120 for the content data 108.

For example, the receiver module 408 can decode for transmission over each instance of the bit channel 120 in the good-channel set 202, the bad-channel set 204, or a combination thereof. Also for example, the receiver module 408 can decode based on utilizing the likelihood calculation 134 for the relaxed communication mechanism 142.

As a more specific example, the receiver module 408 can decode according to the relaxed decoding mechanism 154 including the likelihood limit 160 limiting the likelihood calculation 134 or switching to a different value or instance of the likelihood calculation 134 in decoding the receiver signal 116. The receiver module 408 can decode based on the good-channel relaxation mechanism 206, the bad-channel relaxation mechanism 208, or a combination thereof. The receiver module 408 can implement the likelihood calculation 134 for instances of the bit channel 120 based on the polar-processing range 146, the relaxed map 148, the relaxed channel information 150, or a combination thereof.

As a further specific example, the receiver module 408 can implement the likelihood calculation 134 for number of iterations or executions for one or more instance of the bit channel 120 up to the polar-processing range 146 associated with the relaxation range 216, the error measure 222 or the boundaries associated therewith, or a combination thereof according to the relaxed map 148, the relaxed channel information 150, or a combination thereof. The receiver module 408 can implement the likelihood calculation 134 for number of iterations or executions up to the polar-processing range 146 less than the total polarization level 140 for one or more instances of the bit channel 120 in the good-channel set 202, the bad-channel set 204, or a combination thereof.

The receiver module 408 can generate the relaxed likelihood result 162 of FIG. 1 based on decoding the receiver signal 116 according to the relaxed decoding mechanism 154 and the bit channel 120. The receiver module 408 can utilize the polar-processing range 146 resulted from evaluating the polar processing mechanism 126 for the bit channel 120. The receiver module 408 can implement the likelihood calculation 134 for the good bit-channel 122, the bad bit-channel 124, or a combination thereof up to a limit prescribed by the polar-processing range 146 resulted from evaluating the polar processing mechanism 126 for the bit channel 120.

The receiver module 408 can further implement the relaxed communication mechanism 142 based on the polar-processing range 146 associated with the error measure 222. For example, the receiver module 408 can generate the relaxed likelihood result 162 based on the polar-processing range 146, such as the likelihood limit 160, resulting from processing the upper measure boundary 224, the lower measure boundary 226, or a combination thereof representing the error measure 222. Also for example, the transmission module 406 can generate the relaxed likelihood result 162 based on the polar-processing range 146 resulting from processing the error measure 222 directly calculated for representing the bit channel 120 when the content data 108 corresponds to the short block 112.

The receiver module 408 can decode using the successive cancellation decoder 136 of FIG. 1. The receiver module 408 can implement the successive cancellation decoder 136 to calculate and generate the relaxed likelihood result 162. The receiver module 408 can calculate and generate the relaxed likelihood result 162 based on:

$$L_l^{(i)}(y_1^l, \hat{u}_1^{i-1}) = \frac{\tilde{w}_l^{(i)}(y_1^l, \hat{u}_1^{i-1} | u_i = 0)}{\tilde{w}_l^{(i)}(y_1^l, \hat{u}_1^{i-1} | u_i = 1)} \quad \text{Equation (7)}$$

The relaxed likelihood result 162 can be represented as '$L_l^{(i)}$'. The relaxed likelihood result 162 can be a likelihood of the relaxed code word 158, represented as '$u_i$', given the channel outputs for the receiver signal 116, represented as '$y_1^l$'. The term '$\hat{u}_1^{i-1}$' can represent previously decided bits for the successive cancellation decoder 136. The term 'i' can represent an index corresponding to portions of the relaxed code word 158, ranging up to the polar code length 138 of the relaxed code word 158, represented as 'l'. The term 'W' can represent the BMS channel including the communication channel 118 or the bit channel 120.

The receiver module 408 can decode based on calculating or generating the relaxed likelihood result 162 according to the relaxed coding profile 144. For example, the receiver module 408 can calculate or generate up to the polar-processing range 146 less than the total polarization level 140. Also for example, the receiver module 408 can calculate or generate based on the polar-processing range 146 represented by the relaxed map 148, the relaxed channel information 150.

As a more specific example, the terms '$u_{1,o}^j$' and '$u_{1,e}^j$' can represent the sub-vectors with odd and even indices, respectively. The receiver module 408 can decode recursively using the likelihood calculation 134 as in decoding of fully polarized polar codes when the relaxed map 148 does not indicate the likelihood limit 160, such as including a zero or a 'FALSE' value. The receiver module 408 can further implement the likelihood calculation 134 and calculate the relaxed likelihood result 162 based on:

$$L_l^{(2i-1)}(y_1^l, \hat{u}_1^{2i-2}) = \quad \text{Equation (8)}$$

$$\frac{1 + L_{l/2}^{(i)}(y_1^{l/2}, \hat{u}_{1,e}^{2i-2} \oplus \hat{u}_{1,o}^{2i-2}) L_{l/2}^{(i)}(y_{l/2+1}^l, \hat{u}_{1,e}^{2i-2})}{L_{l/2}^{(i)}(y_1^{l/2}, \hat{u}_{1,e}^{2i-2} \oplus \hat{u}_{1,o}^{2i-2}) + L_{l/2}^{(i)}(y_{l/2+1}^l, \hat{u}_{1,e}^{2i-2})}.$$

$$L_l^{(2i)}(y_1^l, \hat{u}_1^{2i-1}) =$$

$$[L_{l/2}^{(i)}(y_1^{l/2}, \hat{u}_{1,e}^{2i-2} \oplus \hat{u}_{1,o}^{2i-2})]^{1-2\hat{u}_{2i-1}} L_{l/2}^{(i)}(y_{l/2+1}^l, \hat{u}_{1,e}^{2i-2}).$$

Continuing with the more specific example, the receiver module 408 can decode and switch to a different value or instance of the likelihood calculation 134 with a different value or instance of relaxed likelihood result 162 when the likelihood limit 160 is reached or indicated. The receiver module 408 can calculate and generate the relaxed likelihood result 162 differently when the relaxed map 148 does not indicate the likelihood limit 160, such as including a non-zero value or a 'TRUE' value. The receiver module 408 calculate the relaxed likelihood result 162 differently based on:

$$L_l^{(2i-1)}(y_1^l, \hat{u}_1^{2i-2}) = L_{l/2}^{(i)}(y_1^{l/2}, \hat{u}_{1,o}^{2i-2}).$$

$$L_l^{(2i)}(y_1^l, \hat{u}_1^{2i-1}) = L_{l/2}^{(i)}(y_{l/2+1}^l, \hat{u}_{1,e}^{2i-2}). \quad \text{Equation (9)}.$$

The receiver module 408 can set the instances of the relaxed likelihood result 162 after the processing limit based on the relaxation range 216. At the last stage of the relaxed communication mechanism 142 when 'l=1', the relaxed likelihood result can be represented as '$L_1^{(1)}(y_i) = W(y_i|0)/W(y_i|1)$'. The receiver module 408 can make hard decisions based on '$L_l^{(i)}$', except for frozen bit-channels '$W_l^{(i)}$' where '$\hat{u}_i = u_i = 0$' to recover the content data 108. The receiver module 408 can have prior knowledge of relaxed nodes and non-relaxed nodes for implementing the relaxed decoding mechanism 154 based on the relaxed coding profile 144.

It has been discovered that the relaxed communication mechanism 142 limiting the likelihood calculation 134 based on the relaxed coding profile 144 provides reduced computational and time complexity for implementing the polar coding scheme while maintaining the error rate 168 and the communication rate 164. The reduction in iterations for the likelihood calculation 134 can provide the reduction in complexity. The relaxed coding profile 144 based on the relaxation range 216 specific for the channel condition for each instance of the bit channel 120, the communication rate 164, the error rate 168, or a combination thereof can prevent degradation in communication performance from limiting the channel polarization 132.

It has further been discovered that the relaxed decoding mechanism 154 using the relaxed coding profile 144 for the good-channel set 202 according to the good-channel relaxation mechanism 206 provides reduction in physical area and power for hardware implementation. It has been discovered that the relaxed decoding mechanism 154 processing the content data 108 using the relaxed coding profile 144 for the bad-channel set 204 according to the bad-channel relaxation mechanism 208 provides reduction in physical area and power for hardware implementation. The lower overall implementation of the channel polarization 132, the use of the polar-processing range 146, the relaxed map 148, the relaxed channel information 150, or a combination thereof pre-processed can provide the reduction in physical area and power for hardware implementation. Decoding of relaxed polar codes can result in smaller bit-channel relaxed likelihood result than for fully polarized polar codes. The computing system 100 can utilize smaller bit-widths for storage and calculations.

It has further been discovered that the relaxed decoding mechanism 154 including the good-channel relaxation mechanism 206 provides reduced processing complexity and lower bit-error rate. The computing system 100 can use the good-channel relaxation mechanism 206 to decode over the good bit-channel 122 only up to a point to ensure quality communication without over implementing the likelihood calculation 134.

It has further been discovered that the relaxed decoding mechanism 154 including the bad-channel relaxation mechanism 208 provides reduced processing complexity and lower bit-error rate. The computing system 100 can use the bad-channel relaxation mechanism 208 to decode over the bad bit-channel 124 only up to a point to ensure quality communication without over implementing the likelihood calculation 134.

The receiver module 408 can use the first communication unit 316, the second communication unit 336, the first control unit 312, the second control unit 334, or a combination thereof to implement the relaxed communication mechanism 142 and generate the relaxed likelihood result 162. The receiver module 408 can store the relaxed likelihood result 162 or other processing results in the first communication unit 316, the second communication unit 336, the first storage unit 314, the second storage unit 346, or a combination thereof.

Figure 5:
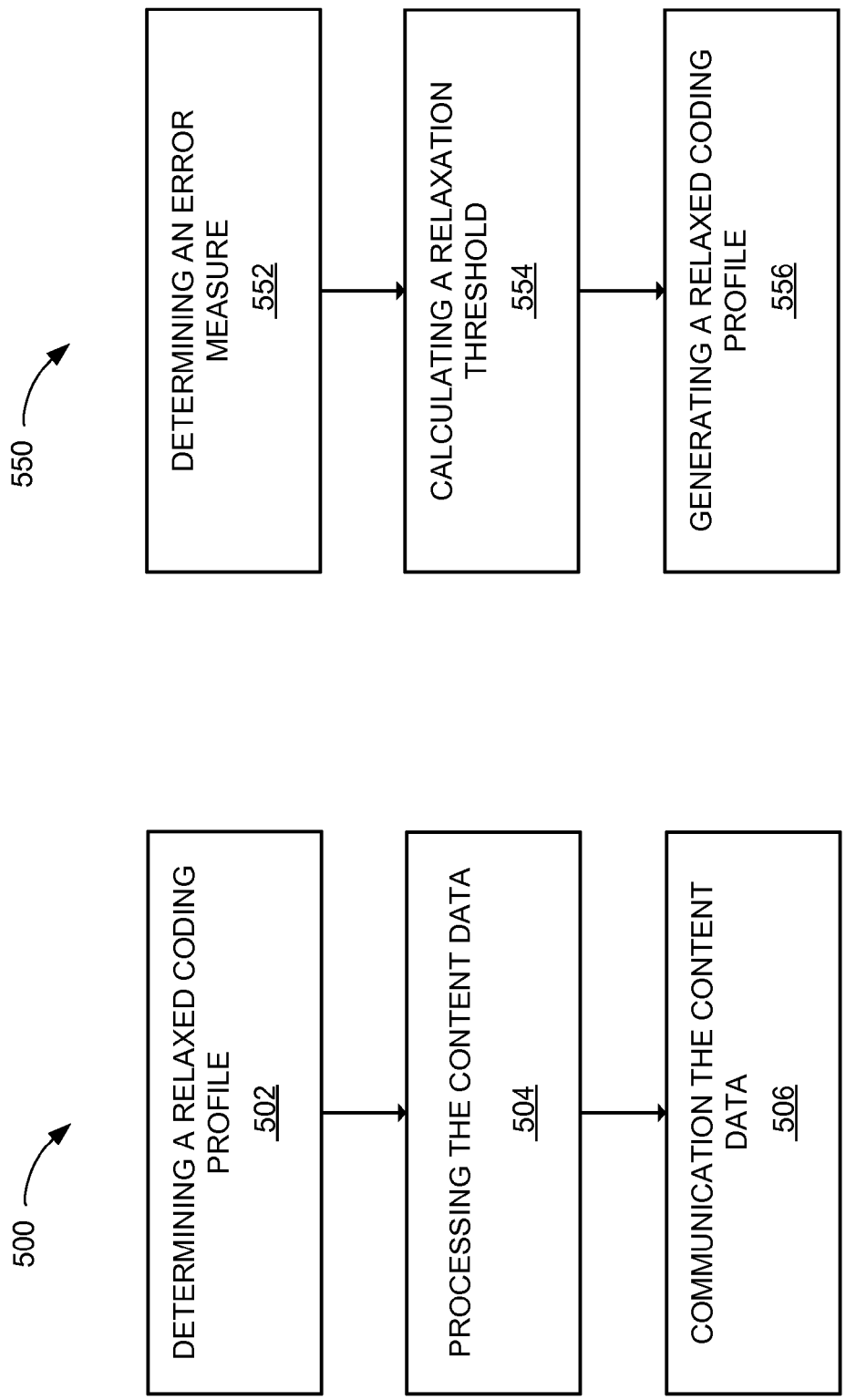
FIG. 5 is a flow chart of a method of operation of a computing system in a further embodiment of the present invention.

Referring now to FIG. 5, therein is shown a flow chart 500 of a method of operation of a computing system in a further embodiment of the present invention. The method 500 includes: determining a relaxed coding profile including a polar-processing range for processing content data over a bit channel in a block 502; processing the content data with a communication unit based on a total polarization level being within the polar-processing range, the polar-processing range for controlling a polar processing mechanism or a portion therein corresponding to the bit channel for the content data in a block 504; and communicating the content data in a block 506.

A further flow chart 550 of a further method of operation of a computing system in a further embodiment of present invention is shown in FIG. 5. The further method 550 includes: determining an error measure for representing a bit channel associated with communicating content data in a block 552; calculating a relaxation range based on a target error, a communication rate, a polar code length, or a combination thereof for communicating the content data in a block 554; and generating a relaxed coding profile with a communication unit based on the relaxation range for a relaxed communication mechanism for limiting processing for the content data corresponding to the bit channel based on the relaxation range in a block 556.

The modules described in this application can be hardware implementation or hardware accelerators, including passive circuitry, active circuitry, or both, in the first communication unit 316 of FIG. 3, the second communication unit 336 of FIG. 3, the first control unit 312 of FIG. 3, the second control unit 338 of FIG. 3, or a combination thereof. The modules can also be hardware implementation or hardware accelerators, including passive circuitry, active circuitry, or both, within the first device 102 of FIG. 1, the second device 106 of FIG. 1, or a combination thereof but outside of the first communication unit 316, the second communication unit 336, the first control unit 312, the second control unit 334, or a combination thereof.

The computing system 100 of FIG. 1 has been described with module functions or order as an example. The computing system 100 can partition the modules differently or order the modules differently. For example, the relaxed construction module 402 and the communication formatting module 404 can be combined. Also for example, the transmission module 406 can include a sub-module for transmission of information and a separate sub-module for encoding the information. Also for example, the receiver module 408 can include a sub-module for receiving the receiver signal 116 of FIG. 1, a separate sub-module for detecting, decoding, or a combination thereof.

For illustrative purposes, the various modules have been described as being specific to the first device 102, the second device 106, or a combination thereof. However, it is understood that the modules can be distributed differently. For example, the various modules can be implemented in a different device, or the functionalities of the modules can be distributed across multiple devices. Also as an example, the various modules can be stored in a non-transitory memory medium.

As a more specific example, one or more modules described above can be stored in the non-transitory memory medium for distribution to a different system, a different device, a different user, or a combination thereof, for manufacturing, or a combination thereof. Also as a more specific example, the modules described above can be implemented or stored using a single hardware unit, such as a chip or a processor, or across multiple hardware units.

The modules described in this application can be stored in the non-transitory computer readable medium. The first communication unit 316, the second communication unit 336, the first storage unit 314 of FIG. 3, the second storage unit 346 of FIG. 3, or a combination thereof can represent the non-transitory computer readable medium. The first communication unit 316, the second communication unit 336, the first storage unit 314, the second storage unit 346, or a combination thereof, or a portion therein can be removable from the first device 102, the second device 106, or a combination thereof. Examples of the non-transitory computer readable medium can be a non-volatile memory card or stick, an external hard disk drive, a tape cassette, or an optical disk.

The physical transformation of the relaxed coding profile 144 of FIG. 1 results in the movement in the physical world, such as content displayed or recreated for the user on the first device 102 from processing the content data 108 of FIG. 1 communicated using the relaxed communication mechanism 142 of FIG. 1. The content reproduced on the first device 102, such as navigation information or voice signal of a caller, can influence the user's movement, such as following the navigation information or replying back to the caller. Movement in the physical world results in changes to the geographic location of the first device 102 and influence the bit channel 120 of FIG. 1, which can be fed back into the computing system 100 and affect the relaxed coding profile 144, the channel polarization 132 of FIG. 1, the likelihood calculation 134 of FIG. 1, or a combination thereof.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A computing system comprising:
   a communication unit including microelectronics configured to:
     determine a relaxed coding profile including a polar-processing range based on a relaxation range, wherein:
       the relaxation range is for representing one or more thresholds controlling a coding process based on transforming a bit channel, and
       the polar-processing range is for processing content data over the bit channel;
     process the content data based on a total polarization level being within the polar-processing range, wherein:

the polar-processing range is for controlling a polar processing mechanism or a portion therein according to the relaxation range, and the polar processing mechanism is for processing to transform the bit channel for the content data; and an inter-device interface, coupled to the communication unit, configured to communicate the content data.

2. The system as claimed in claim 1 wherein:
the communication unit is configured to generate a relaxed code word based on encoding the content data according to a relaxed encoding mechanism and the bit channel for processing the content data; and
the inter-device interface is configured to transmit a transmitter signal based on the relaxed code word for communicating the content data.

3. The system as claimed in claim 1 wherein:
the inter-device interface is configured to receive a receiver signal for communicating the content data over the bit channel; and
the communication unit is configured to recover the content data based on decoding the receiver signal according to a relaxed decoding mechanism and the bit channel for processing the content data.

4. The system as claimed in claim 1 wherein the communication unit is configured to process the content data based on the polar-processing range associated with the relaxation range for evaluating the polar processing mechanism or the portion therein for the bit channel.

5. The system as claimed in claim 1 wherein the communication unit is configured to process the content data based on the polar-processing range associated with error measure calculated for representing the bit channel.

6. The system as claimed in claim 1 wherein the communication unit is configured to process the content data based on a good-channel relaxation mechanism, a bad-channel relaxation mechanism, or a combination thereof.

7. The system as claimed in claim 6 wherein the communication unit is configured to encode according to a relaxed encoding mechanism including polarization limit limiting channel polarization for encoding the content data.

8. The system as claimed in claim 6 wherein the communication unit is configured to decode according to a relaxed decoding mechanism including likelihood limit limiting likelihood calculation for recovering the content data.

9. The system as claimed in claim 6 wherein the communication unit is configured to determine the relaxed coding profile generated with or without utilizing a bad-channel relaxation condition.

10. The system as claimed in claim 6 wherein the communication unit is configured to determine the relaxed coding profile generated based on a bad-channel limiting condition.

11. A method of operation of a computing system comprising:
determining a relaxed coding profile including a polar-processing range based on a relaxation range, wherein:
the relaxation range is for representing one or more thresholds controlling a coding process based on transforming a bit channel, and
the polar-processing range is for processing content data over a bit channel;
processing the content data with a communication unit based on a total polarization level being within the polar-processing range, wherein:
the polar-processing range is for controlling a polar processing mechanism or a portion therein according to the relaxation range, and the polar processing mechanism is for processing to transform the bit channel for the content data; and
communicating the content data.

12. The method as claimed in claim 11 wherein:
processing the content data includes generating generate a relaxed code word based on encoding the content data according to a relaxed encoding mechanism and the bit channel for processing the content data; and
communicating the content data includes transmitting a transmitter signal based on the relaxed code word.

13. The method as claimed in claim 11 wherein:
communicating the content data includes receiving a receiver signal for communicating the content data over the bit channel; and
processing the content data includes recovering the content data based on decoding the receiver signal according to a relaxed decoding mechanism and the bit channel.

14. The method as claimed in claim 11 wherein processing the content data includes processing the content data based on the polar-processing range associated with the relaxation range for evaluating the polar processing mechanism for the bit channel.

15. The method as claimed in claim 11 wherein processing the content data includes processing the content data based on the polar-processing range associated with error measure calculated for representing the bit channel.

16. A method of operation of a computing system comprising:
determining an error measure for representing a bit channel associated with communicating content data;
calculating a relaxation range based on a target error, a communication rate, a polar code length, or a combination thereof for communicating the content data, wherein the relaxation range is for representing one or more thresholds controlling a coding process based on transforming the bit channel; and
generating a relaxed coding profile with a communication unit based on the relaxation range for a relaxed communication mechanism, wherein the relaxed coding profile is for controlling a polar processing mechanism configured to process the content data corresponding to transformation of the bit channel based on the relaxation range.

17. The method as claimed in claim 16 wherein:
determining the error measure includes:
calculating a upper measure boundary for representing the error measure,
calculating a lower measure boundary for representing the error measure;
calculating the relaxation range includes:
calculating a good-channel range for evaluating channel polarization or likelihood calculation for the content data processed through the bit channel,
calculating a bad-channel range for evaluating the channel polarization or the likelihood calculation for the content data processed through the bit channel; and
generating the relaxed coding profile includes generating the relaxed coding profile including a polar-processing range based on comparing the good-channel range and the upper measure boundary, based on comparing the bad-channel range and the lower measure boundary, or a combination thereof for limiting the channel polarization or the likelihood calculation in processing the content data.

18. The method as claimed in claim 16 wherein generating the relaxed coding profile includes generating the relaxed coding profile including a polar-processing range controlling utilization of a bad-channel relaxation mechanism based on a bad-channel limiting condition, the bad-channel relaxation mechanism for limiting channel polarization or likelihood calculation for the content data processed through a bad bit-channel.

19. The method as claimed in claim 16 wherein generating the relaxed coding profile includes generating the relaxed coding profile including a relaxed channel information for the relaxed communication mechanism for representing a good-channel set, a bad-channel set, or a combination thereof for communicating the content data.

20. A non-transitory computer readable medium including instructions for a computing system comprising:
   determining an error measure for representing a bit channel associated with communicating content data;
   calculating a relaxation range based on a target error, a communication rate, a polar code length, or a combination thereof for communicating the content data, wherein the relaxation range is for representing one or more thresholds controlling a coding process based on transforming the bit channel; and
   generating a relaxed coding profile based on the relaxation range for a relaxed communication mechanism wherein the relaxed coding profile is for controlling a polar processing mechanism configured to process the content data corresponding to transformation of the bit channel based on the relaxation range.

* * * * *